US011430725B2

(12) United States Patent
Shimizu et al.

(10) Patent No.: US 11,430,725 B2
(45) Date of Patent: Aug. 30, 2022

(54) WIRING BOARD AND METHOD OF MANUFACTURING THE SAME

(71) Applicant: SHINKO ELECTRIC INDUSTRIES CO., LTD., Nagano (JP)

(72) Inventors: Noriyoshi Shimizu, Nagano (JP); Wataru Kaneda, Nagano (JP); Akio Rokugawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 31 days.

(21) Appl. No.: 17/201,631

(22) Filed: Mar. 15, 2021

(65) Prior Publication Data

US 2021/0202361 A1 Jul. 1, 2021

Related U.S. Application Data

(62) Division of application No. 14/663,921, filed on Mar. 20, 2015, now Pat. No. 10,978,383.

(30) Foreign Application Priority Data

Mar. 25, 2014 (JP) .................................. 2014-062735

(51) Int. Cl.
*H05K 1/03* (2006.01)
*H05K 1/02* (2006.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ............... H05K 1/0298; H05K 1/0373; H05K 2201/068
See application file for complete search history.

(56) References Cited

U.S. PATENT DOCUMENTS 5,231,751 A 8/1993 Sachdev
6,399,892 B1 6/2002 Milkovich
(Continued)

FOREIGN PATENT DOCUMENTS

JP 2003-023252 1/2003
JP 2003-309208 A 10/2003
(Continued)

OTHER PUBLICATIONS

Japanese Office Action dated Nov. 7, 2017 with English Translation, 13 pages.

*Primary Examiner* — Nathan Milakovich
(74) *Attorney, Agent, or Firm* — Rankin, Hill & Clark LLP

(57) ABSTRACT

A wiring board includes a first wiring layer formed on one surface of a core layer, a first insulating layer formed on the one surface of the core layer so as to cover the first wiring layer, a via wiring embedded in the first insulating layer, a second wiring layer formed on a first surface of the first insulating layer, and a second insulating layer thinner than the first insulating layer formed on the first surface of the first insulating layer so as to cover the second wiring layer. The first wiring layer comprises a pad and a plane layer provided around the pad. One end surface of the via wiring is exposed from the first surface of the first insulating layer and directly bonded to the second wiring layer. The other end surface of the via wiring is directly bonded to the pad in the first insulating layer.

16 Claims, 11 Drawing Sheets

(51) Int. Cl.
    *H01L 23/498* (2006.01)
    *H01L 21/48* (2006.01)
    *H05K 3/46* (2006.01)
    *H01L 25/10* (2006.01)
    *H01L 23/15* (2006.01)
    *H01L 23/14* (2006.01)
    *H05K 1/11* (2006.01)
    *H01L 23/00* (2006.01)
    *H05K 3/38* (2006.01)
    *H05K 3/26* (2006.01)
    *H01L 25/065* (2006.01)

(52) U.S. Cl.
    CPC ...... *H01L 23/49827* (2013.01); *H01L 25/105* (2013.01); *H05K 3/4673* (2013.01); *H01L 23/145* (2013.01); *H01L 23/15* (2013.01); *H01L 23/49811* (2013.01); *H01L 23/49894* (2013.01); *H01L 24/13* (2013.01); *H01L 24/16* (2013.01); *H01L 24/32* (2013.01); *H01L 24/73* (2013.01); *H01L 24/92* (2013.01); *H01L 25/0655* (2013.01); *H01L 2224/13111* (2013.01); *H01L 2224/13116* (2013.01); *H01L 2224/13139* (2013.01); *H01L 2224/13147* (2013.01); *H01L 2224/16238* (2013.01); *H01L 2224/32225* (2013.01); *H01L 2224/73204* (2013.01); *H01L 2224/92125* (2013.01); *H01L 2225/1023* (2013.01); *H01L 2225/1058* (2013.01); *H01L 2924/15192* (2013.01); *H01L 2924/15311* (2013.01); *H01L 2924/15331* (2013.01); *H05K 1/0222* (2013.01); *H05K 1/0225* (2013.01); *H05K 1/0298* (2013.01); *H05K 1/0366* (2013.01); *H05K 1/0373* (2013.01); *H05K 1/116* (2013.01); *H05K 3/26* (2013.01); *H05K 3/381* (2013.01); *H05K 3/4676* (2013.01); *H05K 2201/0191* (2013.01); *H05K 2201/029* (2013.01); *H05K 2201/0281* (2013.01); *H05K 2201/0293* (2013.01); *H05K 2201/0347* (2013.01); *H05K 2201/068* (2013.01); *H05K 2201/093* (2013.01); *H05K 2201/0969* (2013.01); *H05K 2201/09227* (2013.01); *H05K 2201/09681* (2013.01); *H05K 2203/0514* (2013.01)

(56) References Cited

U.S. PATENT DOCUMENTS

| | | |
|---|---|---|
| 6,521,530 B2 | 2/2003 | Peters |
| 6,764,931 B2 | 7/2004 | Iijima |
| 6,783,652 B2 | 8/2004 | Iijima |
| 7,371,974 B2 | 5/2008 | Toyoda |
| 8,115,113 B2 | 2/2012 | Tanaka |
| 8,212,151 B2 | 7/2012 | Yamamoto |
| 2004/0176938 A1 | 9/2004 | Gisin |
| 2005/0236177 A1 | 10/2005 | Inagaki |
| 2006/0105153 A1 | 5/2006 | Jang |
| 2006/0163740 A1 | 7/2006 | Ohno |
| 2010/0224974 A1 | 9/2010 | Shim |
| 2011/0121445 A1 | 5/2011 | Mori |
| 2011/0155433 A1 | 6/2011 | Funaya |
| 2011/0221069 A1 | 9/2011 | Kunimoto |
| 2012/0049368 A1 | 3/2012 | Tanaka |
| 2012/0068359 A1 | 3/2012 | Mori |
| 2012/0312590 A1 | 12/2012 | Maeda |
| 2012/0326334 A1 | 12/2012 | Sakaguchi |
| 2013/0062108 A1 | 3/2013 | Kondo |
| 2013/0264100 A1 | 10/2013 | Horiuchi |
| 2014/0041923 A1 | 2/2014 | Hisada |
| 2014/0182889 A1 | 7/2014 | Shin |
| 2014/0290997 A1 | 10/2014 | Maeda |
| 2014/0311771 A1 | 10/2014 | Shimizu |
| 2015/0163899 A1 | 6/2015 | Shimizu |
| 2015/0179560 A1 | 6/2015 | Arisaka |
| 2015/0357276 A1 | 12/2015 | Shimizu |
| 2015/0364405 A1 | 12/2015 | Kunimoto |
| 2016/0007460 A1 | 1/2016 | Shimizu |
| 2016/0020163 A1 | 1/2016 | Shimizu |
| 2016/0172287 A1 | 6/2016 | Arisaka |

FOREIGN PATENT DOCUMENTS

| | | |
|---|---|---|
| JP | 2006-100463 A | 4/2006 |
| JP | 2007-258542 A | 10/2007 |
| JP | 2013-062314 A | 4/2013 |

WIRING BOARD AND METHOD OF MANUFACTURING THE SAME

CROSS-REFERENCE TO RELATED APPLICATION

The present application claims priority from Japanese Patent Application No. 2014-062735 filed on Mar. 25, 2014, the entire content of which is incorporated herein by reference. The present application claims priority from and is a divisional of U.S. application Ser. No. 14/663,921, filed Mar. 20, 2015.

BACKGROUND

Technical Field

The present disclosure relates to a wiring board and a method of manufacturing the wiring board.

Related Art

As a wiring board for a semiconductor package on which a semiconductor chip is mounted, a build-up board is used in which insulating layers and wiring layers are formed on upper and lower surfaces of a core layer, for example.

Further, in recent years, miniaturization of electronic equipment on which a semiconductor package is mounted is progressing. As a result, further miniaturization and a high-density wiring layer and the like are required to a wiring board for the semiconductor package.

PRIOR ART LITERATURE

Patent Document

Patent Document 1: Japanese Patent Laid-Open Publication No. 2003-023252

However, because of the surface flatness of a wiring board or the limitation on reduction in a diameter of a via by a laser processing, there is a limitation on miniaturization of the wiring. As a result, in the current situation, it is not possible to meet the demand for a high-density wiring layer.

SUMMARY

Exemplary embodiments of the invention provide a wiring board and a method of manufacturing the wiring board that is capable of realizing a high-density wiring layer.

A wiring board according to an exemplary embodiment comprises:
 a core layer;
 a first wiring layer formed on one surface of the core layer;
 a first insulating layer formed on the one surface of the core layer so as to cover the first wiring layer;
 a via wiring embedded in the first insulating layer;
 a second wiring layer formed on a first surface of the first insulating layer, the first surface being an opposite surface of a surface in contact with the core layer; and
 a second insulating layer formed on the first surface of the first insulating layer so as to cover the second wiring layer, the second insulating layer being thinner than the first insulating layer,
 wherein the first wiring layer comprises a pad and a plane layer provided around the pad,
 one end surface of the via wiring is exposed from the first surface of the first insulating layer and directly bonded to the second wiring layer, and
 the other end surface of the via wiring is directly bonded to the pad in the first insulating layer.

According to the exemplary embodiment, it is possible to provide a wiring board and a method of manufacturing the wiring board that is capable of realizing a high-density wiring layer.

DETAILED DESCRIPTION

Figure 1A:
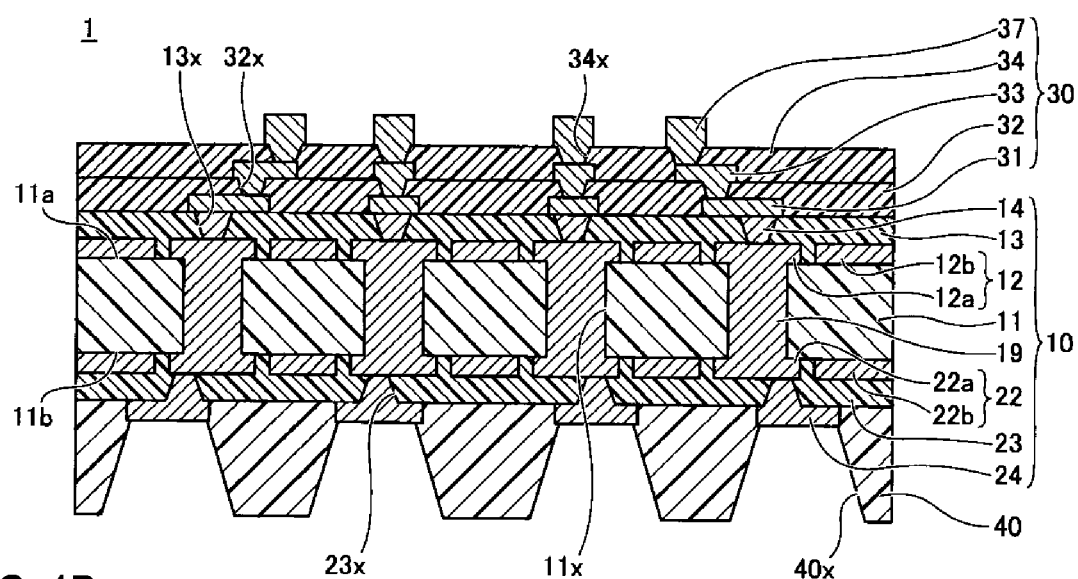
FIGS. 1A and 1B are views illustrating a wiring board according to a first embodiment.

Hereinafter, an illustrative embodiment for carrying out the present invention will be described with reference to the drawings. In each of the drawings, the same components are denoted by the same reference numerals and a duplicated description thereof is omitted.

First Embodiment

Structure of Wiring Board According to First Embodiment

Figure 1B:
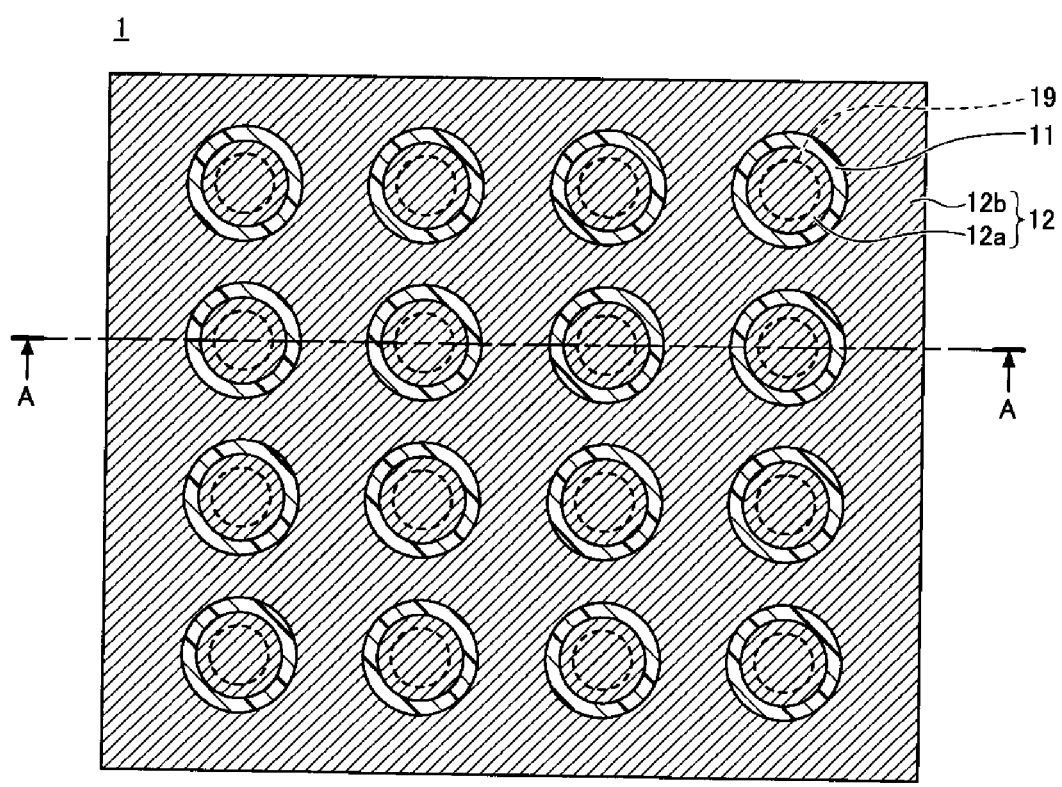

First, a structure of a wiring board according to a first embodiment is described. FIGS. 1A and 1B are views illustrating the wiring board according to the first embodiment. FIG. 1B is a plan view and FIG. 1A is a sectional view taken along a line A-A in FIG. 1B. Here, layers above a wiring layer 12 are not shown in FIG. 1B. For convenience, hatchings corresponding to the sectional view of FIG. 1A are made in the plan view of FIG. 1B.

Referring to FIG. 1A, a wiring board 1 according to the first embodiment includes a first wiring member 10, a second wiring member 30 formed on one side of the first wiring member 10, and a solder resist layer 40 formed on the other side of the first wiring member 10. The wiring board 1 can have a rectangular planar shape, for example. However, the planar shape is not limited thereto. The wiring board 1 can have an arbitrary planar shape.

In the present embodiment, for convenience, the side of a wiring layer 37 of the wiring board 1 refers to an upper side or one side, and the side of a solder resist layer 40 thereof refers to a lower side or the other side. Also, the surface in the wiring layer 37 side of each part refers to one surface or an upper surface, and the surface in the solder resist layer 40 side thereof refers to the other surface or a lower surface. Here, the wiring board 1 can be used in an upside-down state. Alternatively, the wiring board 1 can be placed in an arbitrary angle. Also, a plan view refers to a view of an object, as seen from the normal direction of one surface 11a of a core layer 11. Further, a planar shape refers to a shape of an object, as seen from the normal direction of the one surface 11a of the core layer 11.

Hereinafter, the first wiring member 10, the second wiring member 30 and the solder resist layer 40 will be described in detail. First, the first wiring member 10 is described. The first wiring member 10 is a low-density wiring layer that is formed with a wiring layer having a wiring density lower than that of a wiring layer of the second wiring member 30. The core layer 11 is provided at a substantially central portion of the first wiring member 10. As the core layer 11, a so-called glass epoxy board or the like may be used in which thermosetting insulation resin such as an epoxy-based resin is impregnated in glass cloth, for example. As the insulation resin, a polyimide-based resin or a cyanate-based resin or the like may be used. Further, as the core layer 11, a board or the like may be used in which the thermosetting insulation resin such as an epoxy-based resin is impregnated in a non-woven fabric or woven fabric such as glass fiber, carbon fiber and aramid fiber. The thickness of the core layer 11 can be, for example, approximately 80 to 400 μm. In each of the drawings, the glass cloth or the like is not shown.

The core layer 11 is formed with a plurality of through holes 11x. The planar shape of the through holes 11x can be a circular shape with a diameter of approximately 100 to 200 μm, for example. The pitch of the through holes 11x can be, for example, approximately 200 to 400 μm. Through wirings 19 are formed in the through holes 11x. As the material of the through wiring 19, for example, copper (Cu) or the like can be used. The through holes may be provided at a central portion of the through wirings 19 and the insulation resin such as the epoxy-based resin may be filled in the through holes.

The wiring layer 12, an insulating layer 13 and a wiring layer 14 are sequentially formed on the one surface 11a of the core layer 11. A wiring layer 22, an insulating layer 23 and a wiring layer 24 are sequentially formed on the other surface 11b of the core layer 11. The wiring layer 12 is a typical example of a first wiring layer according to the present invention. Also, the wiring layer 14 is a typical example of a via wiring layer according to the present invention. Also, the insulating layer 13 is a typical example of a first insulating layer according to the present invention. Also, the wiring layer 22 is a typical example of a third wiring layer according to the present invention. Also, the insulating layer 23 is a typical example of a third insulating layer according to the present invention. Also, the wiring layer 24 is a typical example of a fourth wiring layer according to the present invention.

The wiring layer 12 is formed on the one surface 11a of the core layer 11 and includes a pad 12a and a plane layer 12b. Around the pad 12a, the plane layers 12b are provided in a predetermined gap (e.g., about 20 μm). The pad 12a and the plane layers 12b are not in a conductive state. The wiring layer 22 is formed on the other surface 11b of the core layer 11 and includes a pad 22a and a plane layer 22b. Around the pad 22a, the plane layers 22b are provided in a predetermined gap (e.g., about 20 μm). The pad 22a and the plane layers 22b are not in a conductive state.

The pad 12a and the pad 22a are electrically connected to each other via the through wiring 19 penetrating the core layer 11. The pad 12a and the pad 22a can be formed, for example, at overlapped positions, as seen in a plan view. The plane layer 12b and the plane layer 22b can be formed, for example, at overlapped positions, as seen in a plan view. As the material of the wiring layers 12, 22, for example, copper (Cu) or the like can be used. The thickness of the wiring layers 12, 22 can be, for example, approximately 15 to 35 μm.

Here, the plane layer refers to a layer that is provided on the substantially entire surface of a predetermined surface, except for a signal wiring region provided with a signal wiring (e.g., pad 12a). The ratio of the area of the signal wiring region to the area of the predetermined surface varies depending on the type of the wiring board. Accordingly, the ratio of the area of the plane layer to the area of the predetermined surface also varies depending on the type of the wiring board. The ratio of the area of the plane layer to the area of the predetermined surface is not particularly limited but can be, for example, approximately 20% to 60%.

In the present embodiment, the plane layer 12b is provided for easily flattening the upper surface of the insulating layer 13 formed on the wiring layer 12. Therefore, the magnitude of the ratio of the area of the plane layer 12b to the area of the one surface 11a of the core layer 11 is not important. However, it is preferable that the ratio of the total area of the pad 12a and the plane layer 12b to the area of the one surface 11a of the core layer 11 is greater. The ratio (remaining copper rate when the material of the wiring layer 12 is copper) of the total area of the pad 12a and the plane layer 12b to the area of the one surface 11a of the core layer 11 is preferably in a range of 70% to 90%, suitably in a range of 80% or more. The plane layers 12b, 22b may be divided into a plurality of regions independent of each other.

The insulating layer 13 is formed on the one surface 11a of the core layer 11 so as to cover the wiring layer 12. As the material of the insulating layer 13, a non-photosensitive insulating resin (e.g., thermosetting resin) mainly composed of epoxy-based resin or the like, for example, can be used. Other non-photosensitive insulating resin such as a non-photosensitive insulating resin mainly composed of polyimide-based resin or the like may be used. The thickness of the insulating layer 13 can be, for example, approximately 20 to 45 μm. The insulating layer 13 may contain fillers such as silica ($SiO_2$).

Meanwhile, it is not preferable that a photosensitive insulating resin is used as the insulating layer 13. The reason is as follows. That is, since the photosensitive insulating resin used as the insulating layer 13 is generally formed by the application of liquid-phase resin, it is difficult to form a thick insulating layer. Therefore, the insulating layer has a shape along the irregularities formed by the wiring layer 12 with a thickness of approximately 15 to 35 μm and the one surface 11a of the core layer 11. As a result, it is difficult to flatten the upper surface of the insulating layer 13.

The wiring layer 14 is a via wiring embedded in the insulating layer 13. More specifically, the wiring layer 14 is a via wiring that is filled in a via hole 13x. The via hole 13x penetrates the insulating layer 13 and exposes one surface of the wiring layer 12. The wiring layer 14 is electrically connected to the wiring layer 12. The via hole 13x is formed as a recess where the area of an opening portion opened toward the second wiring member 30 is greater than the area of the bottom of an opening portion formed by the upper surface of the wiring layer 12. For example, when the opening portions on both sides of the via hole 13x are circular, the via hole 13x is formed as an inverted truncated cone-shaped recess. In this case, the diameter of the opening portion of the via hole 13x opened toward the second wiring member 30 can be, for example, approximately 60 to 70 μm.

By the shape of the via hole 13x formed in this way, the area of one end surface (end surface on the second wiring member 30 side) of the wiring layer 14 is greater than that of the other end surface (end surface on the core layer 11 side) thereof. The one end surface of the wiring layer 14 can be flush with an upper surface (first surface) of the insulating layer 13, for example. The one end surface of the wiring layer 14 is exposed from the upper surface of the insulating layer 13 and directly bonded to a wiring layer 31 constituting the second wiring member 30. Further, the other end surface of the wiring layer 14 is directly bonded to the upper surface of the pad 12a in the insulating layer 13. For example, the material of the wiring layer 14 can be the same as that of the wiring layer 12.

The upper surface of the insulating layer 13 is a polished surface in order to improve the flatness. For example, the upper surface has a surface roughness Ra of approximately 15 to 40 nm. This corresponds to approximately 1/10 of the roughness before polishing. The flatness is improved by reducing the roughness of the upper surface of the insulating layer 13. By doing so, the wiring layer 31 which is a fine wiring (high-density wiring pattern) can be formed on the upper surface of the insulating layer 13.

In this way, in the present embodiment, the wiring layer 14 on the second wiring member 30 side is made of only a via wiring formed in the via hole 13x of the insulating layer 13. In other words, the wring pattern integrally formed on the upper surface of the insulating layer 13 is not present in the wiring layer 14. Although being electrically connected to each other, the wiring layer 14 and the wiring layer 31 are not integral. With this structure, the upper surface of the insulating layer 13 can be a flat surface. Accordingly, the high-density wiring pattern as the wiring layer 31 can be formed on the insulating layer 13. A wiring density of the wiring layer 31 is higher than a wiring density of the wiring layer 12. Specifically, as the high-density wiring pattern, a wiring pattern can be formed which has a line/space equal to or less than 5 μm/5 μm. For example, a wiring pattern can be formed which has the line/space of approximately 1 μm/1 μm.

When the wiring layer 31 is formed by a semi-additive process in a manufacturing method described below, the wiring layer 31 has a structure where an electrolytic plating layer is formed on a seed layer. Further, the one end surface of the wiring layer 14 that is a via wiring is directly bonded to the seed layer (e.g., a stacked structure of titanium (Ti) layer and copper (Cu) layer, etc.) constituting the wiring layer 31.

The insulating layer 23 is formed on the other surface 11b of the core layer 11 so as to cover the wiring layer 22. The material and thickness of the insulating layer 23 can be the same as those of the insulating layer 13, for example. The insulating layer 23 may contain fillers such as silica ($SiO_2$).

The wiring layer 24 is formed on the other side of the insulating layer 23 and electrically connected to the wiring layer 22. The wiring layer 24 includes a via wiring filled into a via hole 23x and a wiring pattern formed on a lower surface (second surface) of the insulating layer 23. The via hole 23x penetrates the insulating layer 23 and exposes the other surface of the wiring layer 22. The via hole 23x is formed as a truncated cone-shaped recess where a diameter of an opening portion opened toward the solder resist layer 40 is greater than a diameter of the bottom of an opening portion formed on the lower surface of the wiring layer 22. The diameter of the via hole 23x can be, for example, approximately 60 to 70 μm.

The material of the wiring layer 24 or the thickness of the wiring pattern constituting the wiring layer 24 can be the same as the wiring layer 12, for example. The line/space of the wiring pattern constituting the wiring layer 24 can be, for example, approximately 20 μm/20 μm to 40 μm/40 μm. Meanwhile, the line in the line/space refers to a wiring width and the space in the line/space refers to an interval (wiring interval) between adjacent wirings. For example, the line/space represented as 20 μm/20 μm means that the wiring width is 20 μm and the interval between adjacent wirings is 20 μm.

In this way, the same number of layers of the insulating layer and the wiring layer are formed on both sides of the core layer 11 in the first wiring member 10. That is, the insulating layer and the wiring layer form a layer structure in a vertical symmetry about the core layer 11. Therefore, the first wiring member 10 has a structure resistant to warpage. Particularly, the balance in the vertical direction is improved by forming each insulating layer in the same thickness, so that a structure resistant to warpage is obtained.

Next, the second wiring member 30 is described. The second wiring member 30 is a high-density wiring layer that is formed with a wiring layer having a wiring density higher than that of the wiring layer of the first wiring member 10. The second wiring member 30 includes the wiring layer 31, an insulating layer 32, a wiring layer 33, an insulating layer 34 and the wiring layer 37, which are sequentially formed on the first wiring member 10. The wiring layer 31 is a typical example of a second wiring layer according to the present invention. Also, the insulating layer 32 is a typical example of a second insulating layer according to the present invention.

The thickness (thickness of a portion including the insulating layers 32, 34 and the wiring layers 31, 33) of the second wiring member 30 can be, for example, approximately 20 to 40 μm. In the present application, "the thickness of the second wiring member 30" refers to a thickness of the portion where only the insulating layers are formed, not including a protruding portion of the wiring layer 37.

The wiring layer 31 is a wiring pattern formed on the upper surface (first surface) of the insulating layer 13 of the first wiring member 10. A portion of the lower surface of the wiring layer 31 is in contact with one end surface of the wiring layer 14 that is a via wiring of the first wiring member 10. The portion of the wiring layer 31 is electrically connected to the one end surface of the wiring layer 14. As the material of the wiring layer 31, for example, copper (Cu) or the like can be used. The wiring layer 31 may be a stacked structure of the copper layer and other metal layer, for example. The thickness of the wiring layer 31 can be, for example, approximately 1 to 3 µm. The line/space of the wiring layer 31 can be, for example, approximately 1 µm/1 µm.

The insulating layer 32 is an insulating layer that is formed on the upper surface of the insulating layer 13 of the first wiring member 10 so as to cover the wiring layer 31. The insulating layer 32 is thinner than the insulating layer 13. As the material of the insulating layer 32, a photosensitive insulating resin (e.g., thermosetting resin) mainly composed of phenol-based resin or polyimide-based resin or the like, for example, can be used. The thickness of the insulating layer 32 can be, for example, approximately 5 to 10 µm.

Preferably, the insulating layer 32 contains a smaller amount of filler (particle size of about 1 µm) than the insulating layer 13 or does not contain any filler. The reason is as follows. That is, as the contents of the filler are increased, irregularities due to the filler are liable to be formed on the upper surface of the insulating layer 32. This adversely affects to the high-density of the wiring layer 33 that is formed on the upper surface of the insulating layer 32. Further, as the contents of the filler are increased, the exposure in a photolithography process is impossible.

The wiring layer 33 is formed on one side of the insulating layer 32 and electrically connected to the wiring layer 31. The wiring layer 33 includes a via wiring filled into a via hole 32x and a wiring pattern formed on one surface of the insulating layer 32. The via hole 32x penetrates the insulating layer 32 and exposes the one surface of the wiring layer 31. The via hole 32x is formed as an inverted truncated cone-shaped recess where a diameter of an opening portion opened toward the insulating layer 34 is greater than a diameter of the bottom of an opening portion formed by the upper surface of the wiring layer 31. The diameter of the opening portion of the via hole 32x can be, for example, approximately 10 to 20 µm.

The material of the wiring layer 33 and the thickness and line/space of the wiring pattern constituting the wiring layer 33 can be the same as the wiring layer 31, for example. The thickness of the wiring layer 31 is approximately 1 to 3 µm and is thinner than the thickness of the wiring layer 12, which is approximately 15 to 35 µm. Therefore, the upper surface of the insulating layer 32 can be flattened even when a photosensitive insulating resin (thickness of approximately 5 to 10 µm) is used as the insulating layer 32. It is difficult to cause the photosensitive insulating resin to be thicker, as compared to a non-photosensitive insulating resin (thickness of approximately 20 to 45 µm) constituting the first wiring member 10. As a result, the high-density wiring layer 33 of the same wiring density as the wiring layer 31 can be formed on the upper surface of the insulating layer 32.

Further, the photosensitive insulating resin is used as each insulating layer constituting the second wiring member 30, so that the via hole can be formed by a photolithography process. Accordingly, the planar shape of the via hole can be reduced. As the planar shape of the via hole is reduced, the planar shape of the pads vertically connected through the via hole can be also reduced. As a result, the density of the wiring layer adjacent to each insulating layer can be desirably increased.

Further, since the photosensitive insulating resin does not contain any filler (particle size of about 1 µm) or contains a small amount of filler, irregularities due to the filler are less likely to be formed on the surface of each insulating layer constituting the second wiring member 30. As a result, the density of the wiring layer formed on each insulating layer can be desirably increased.

The insulating layer 34 is formed on one surface of the insulating layer 32 so as to cover the wiring layer 33. The material and thickness of the insulating layer 34 can be, for example, the same as the insulating layer 32. For the same reason as the insulating layer 32, it is desirable that the insulating layer 34 contains a smaller amount of filler than the insulating layer 13 or does not contain any filler.

The wiring layer 37 is formed on one side of the insulating layer 34. The wiring layer 37 includes a via wiring filled into a via hole 34x and a pad protruding from one surface of the insulating layer 34. The via hole 34x penetrates the insulating layer 34 and exposes one surface of the wiring layer 33. The via hole 34x is formed as an inverted truncated cone-shaped recess where a diameter of an opening portion opened toward the pad is greater than a diameter of the bottom of an opening portion formed by the upper surface of the wiring layer 33. The diameter of the opening portion of the via hole 34x can be, for example, approximately 10 to 20 µm.

The material of the wiring layer 37 can be, for example, the same as the wiring layer 31. The thickness (including the pad portion protruding from one surface of the insulating layer 34) of the wiring layer 37 can be, for example, approximately 10 µm. The planar shape of the pad constituting the wiring layer 37 can be, for example, a circular shape with a diameter of approximately 20 to 30 µm. The pitch of the pads constituting the wiring layer 37 can be, for example, 40 to 50 µm. The pad constituting the wiring layer 37 functions as a pad for mounting electronic components such as a semiconductor chip, which is intended to be electrically connected to the electronic components.

A surface treatment layer (not shown) may be formed on a surface (upper surface and side surface) of the pad constituting the wiring layer 37. As an example, the surface treatment layer can include an Au layer, a Ni/Au layer (metal layer where Ni layer and Au layer are formed in this order), or Ni/Pd/Au layer (metal layer where Ni layer, Pd layer and Au layer are formed in this order) or the like. An anti-oxidization treatment such as OSP (Organic Solderability Preservative) treatment may be performed on the surface (upper surface and side surface) of the pad constituting the wiring layer 37, thereby forming the surface treatment layer thereon.

Next, the solder resist layer 40 is described. The solder resist layer 40 is an outermost insulating layer that is formed on a lower surface (second surface) of the insulating layer 23 of the first wiring member 10 so as to selectively expose the wiring layer 24 of the first wiring member 10. As the material of the solder resist layer 40, a photosensitive insulating resin (e.g., thermosetting resin) mainly composed of phenol-based resin or polyimide-based resin or the like, for example, can be used. The solder resist layer 40 may contain fillers such as silica ($SiO_2$). An organic film made of azole compound, imidazole compound or the like is formed on the surface of the wiring layer 24 exposed from the solder resist layer 40 by OSP treatment.

The solder resist layer 40 is provided with an opening portion 40x. A portion of the wiring layer 24 of the first wiring member 10 is exposed to the bottom of the opening portion 40x. The wiring layer 24 exposed to the bottom of the opening portion 40x functions as a pad that is electrically connected to a mounting board such as a motherboard, for example. The surface treatment layer described above may be formed on the lower surface of the wiring layer 24 exposed to the bottom of the opening portion 40x.

The balance in the vertical direction is improved by adjusting the thickness of the solder resist layer 40 to the thickness (total thickness of the insulating layer 32 and the insulating layer 34) of the insulating layers constituting the second wiring member 30, so that the wiring board 1 has a structure resistant to warpage. For example, the thickness of the solder resist layer 40 can be equal to or greater than the thickness (total thickness of the insulating layer 32 and the insulating layer 34) of the insulating layers constituting the second wiring member 30. Specifically, from the viewpoint of suppressing the warpage, it is preferable that the ratio of the thickness of the second wiring member 30 to the thickness of the solder resist layer 40 is approximately 0.75 to 1.

In the wiring board 1, it is desirable that the elastic modulus (shear modulus=transverse elastic modulus) of the core layer 11 is approximately 30 GPa and the thermal expansion coefficient thereof is about 10 ppm/° C. Further, it is desirable that the elastic modulus of the insulating layers 13, 23 mainly composed of the non-photosensitive insulating resin is about 5 to 15 GPa and the thermal expansion coefficient thereof is about 10 to 40 ppm/° C. Further, it is desirable that the elastic modulus of the insulating layers 32, 34 mainly composed of the photosensitive insulating resin is about 5 GPa and the thermal expansion coefficient thereof is about 50 to 70 ppm/° C. Further, it is desirable that the elastic modulus of the solder resist layer 40 mainly composed of the photosensitive insulating resin is about 2 to 4 GPa and the thermal expansion coefficient thereof is about 40 to 50 ppm/° C.

The thermal expansion coefficient of each insulating layer can be adjusted to a predetermined value by the contents of filler, for example. Here, in the insulating layer mainly composed of the photosensitive insulating resin, the exposure is impossible when the contents of the filler are increased. Accordingly, there is a limit (upper limit) to the amount of filler that can be contained. For this reason, the thermal expansion coefficient of the insulating layer mainly composed of the photosensitive insulating resin tends to be greater than that of the insulting layer mainly composed of the non-photosensitive insulating resin. As the filler, for example, kaolin ($Al_2Si_2O_5(OH)_4$), talc ($Mg_3Si_4O_{10}(OH)_2$), alumina ($Al_2O_3$) or the like may be used, in addition to the silica ($SiO_2$) described above. Also, these may be combined.

By using these physical properties (elastic modulus and thermal expansion coefficient), the wiring board 1 has a structure that is gradually soften toward the outer layer from the core layer 11. Therefore, the warpage of the wiring board 1 is suppressed by a synergy effect with the relationship between the thickness of the second wiring member 30 and the solder resist layer 40 described above.

Manufacturing Method of Wiring Board According to First Embodiment

Next, a manufacturing method of the wiring board according to the first embodiment will be described. FIGS. 2A to 7B are views illustrating the manufacturing process of the wiring board according to the first embodiment. In the present embodiment, an example of a process is illustrated where each wiring board is obtained by manufacturing a plurality of parts as wiring boards and then dividing the plurality of parts. However, a process of manufacturing a single wiring board may be employed.

The process shown in FIG. 2A to FIG. 4A is a process of manufacturing the first wiring member 10. First, in the process shown in FIG. 2A, a base material is prepared in which a flat metal foil 120 is formed on one surface 11a of the core layer 11 and a flat metal foil 220 is formed on the other surface 11b thereof. A plurality of through holes 11x is formed in the base material. As the core layer 11, a so-called glass epoxy board or the like can be used in which an insulation resin such as an epoxy-based resin is impregnated in glass cloth, for example.

As the core layer 11, a board or the like may be used in which the insulation resin such as an epoxy-based resin is impregnated in a non-woven fabric or woven fabric such as glass fiber, carbon fiber and aramid fiber. The thickness of the core layer 11 can be, for example, approximately 80 to 400 μm. As the metal foils 120, 220, for example, a copper foil or the like having a thickness of approximately 15 to 35 μm can be used. The through holes 11x can be formed by, for example, a laser machining process or a drilling process and the like. The planar shape of the through hole 11x can be a circular shape with a diameter of approximately 100 to 200 μm, for example. The pitch of the through holes 11x can be, for example, approximately 200 to 400 μm.

Figure 2A:
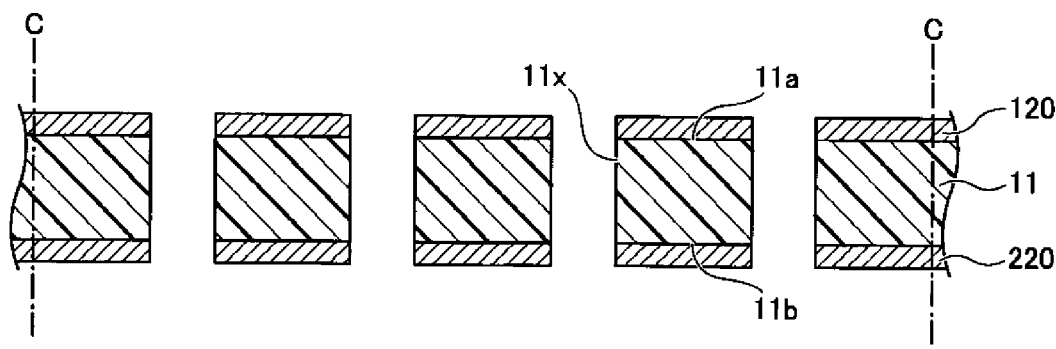
FIGS. 2A to 2C are views (first view) illustrating a manufacturing process of the wiring board according to the first embodiment.
Figure 2B:
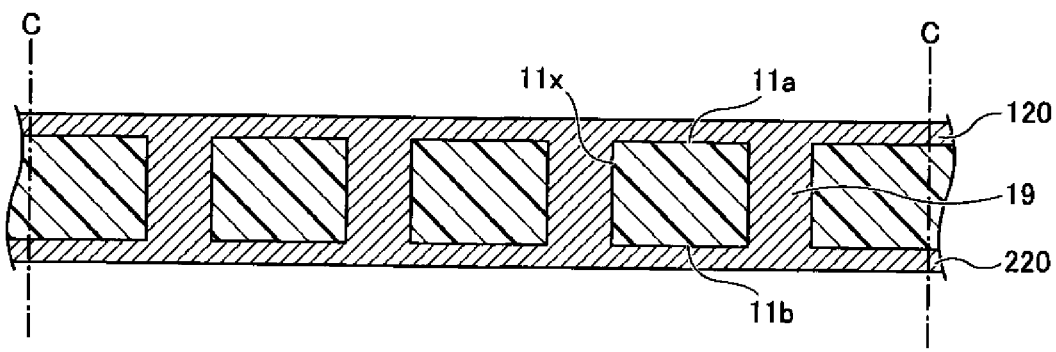

Next, in the process shown in FIG. 2B, the through wiring 19 is formed in each through hole 11x. Specifically, a seed layer made of copper or the like is formed on the metal foils 120, 220 and the inner wall surface of the through hole 11x by, for example, an electroless plating process or the like. Then, by an electrolytic plating process using the seed layer as a power feeding layer, copper or the like is filled into the through hole 11x and a plating layer is formed on the surfaces of the metal foils 120, 220. In this way, the metal foil 120 and the metal foil 220 are electrically connected to each other through the through wiring 19. In FIG. 2B, the seed layer and the plating layer are shown in a state that they are integrated with the metal foils 120, 220 and the through wiring 19. Meanwhile, the through wiring 19 may be formed so as to cover the inner wall surface of each through hole 11x and the insulating resin such as an epoxy-based resin may be filled into the through hole in the center of the through wiring 19.

Figure 2C:
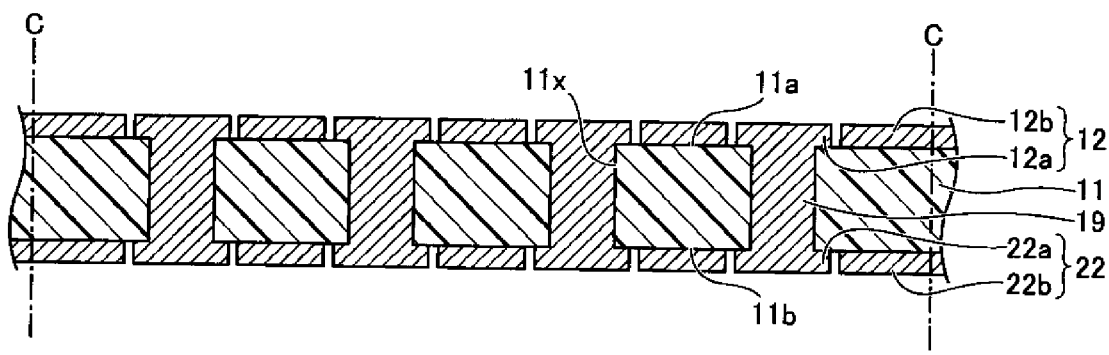

Next, in the process shown in FIG. 2C, the metal foil 120, the seed layer and the plating layer are patterned by, for example, a subtractive process, so that the wiring layer 12 including the pad 12a and the plane layer 12b is formed on the one surface 11a of the core layer 11. Similarly, the metal foil 220, the seed layer and the plating layer are patterned by, for example, the subtractive process, so that the wiring layer 22 including the pad 22a and the plane layer 22b is formed on the other surface 11b of the core layer 11. For example, by the subtractive process or the like, the wiring layers 12, 22 can be formed into the planar shape shown in FIG. 1B. The pad 12a and the pad 22a are electrically connected to each other through the through wiring 19 penetrating the core layer 11.

Figure 3A:
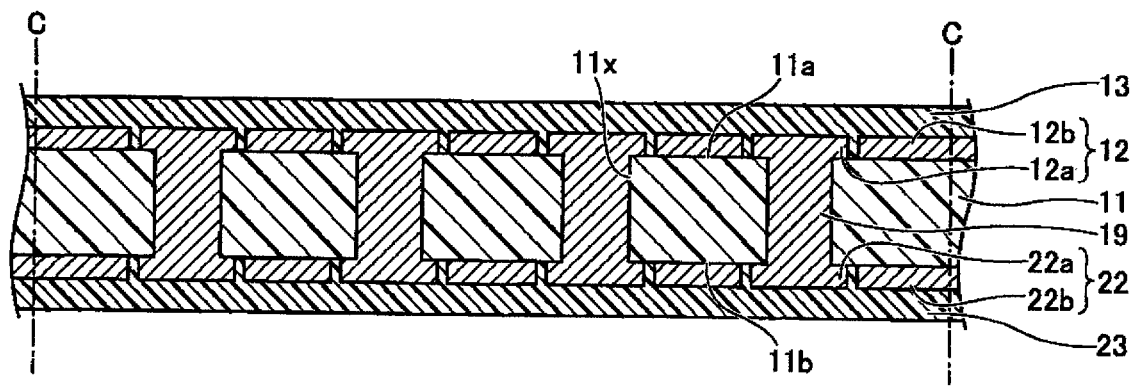
FIGS. 3A to 3C are views (second view) illustrating the manufacturing process of the wiring board according to the first embodiment.

Next, in the process shown in FIG. 3A, the insulating layer 13 is formed on the one surface 11a of the core layer 11 so as to cover the wiring layer 12. Further, the insulating layer 23 is formed on the other surface 11b of the core layer 11 so as to cover the wiring layer 22. As the material of the insulating layers 13, 23, for example, a non-photosensitive insulating resin (thermosetting resin) mainly composed of an epoxy-based resin or the like can be used. The thickness of the insulating layers 13, 23 can be, for example, approximately 20 to 45 μm. The insulating layers 13, 23 may contain fillers such as silica ($SiO_2$).

When a non-photosensitive insulating resin (thermosetting resin) mainly composed of a film-like epoxy-based resin or the like is used as the material of the insulating layers 13, 23, a film-like uncured insulating resin is laminated on the one surface 11a of the core layer 11 so as to cover the wiring layer 12. Further, the film-like uncured insulating resin is laminated on the other surface 11b of the core layer 11 so as to cover the wiring layer 22. Then, the laminated insulating resin is heated to the curing temperature or more and cured while being pressed. In this way, the insulating layers 13, 23 are formed. Meanwhile, the inclusion of voids can be prevented when the insulating resin is laminated in a vacuum atmosphere.

When a non-photosensitive insulating resin (thermosetting resin) mainly composed of a liquid-phase or paste-phase epoxy-based resin or the like is used as the material of the insulating layers 13, 23, a liquid-phase or paste-phase insulating resin is coated on the one surface 11a of the core layer 11 so as to cover the wiring layer 12. The liquid-phase or paste-phase insulating resin can be coated by, for example, a spin coat process or the like. Further, by the spin coat process or the like, the liquid-phase or paste-phase insulating resin is coated on the other surface 11b of the core layer 11 so as to cover the wiring layer 22. Then, the coated insulating resin is heated to the curing temperature or more and cured, thereby forming the insulating layers 13, 23.

Meanwhile, the adhesion between the wiring layers 12, 22 and the insulating layers 13, 23 is desirably improved when the upper surface of the wiring layer 12 and the lower surface of the wiring layer 22 are roughened prior to forming the insulating layers 13, 23. The roughening of the upper surface of the wiring layer 12 and the lower surface of the wiring layer 22 can be carried out by, for example, a wet etching using a formic acid.

Figure 3B:
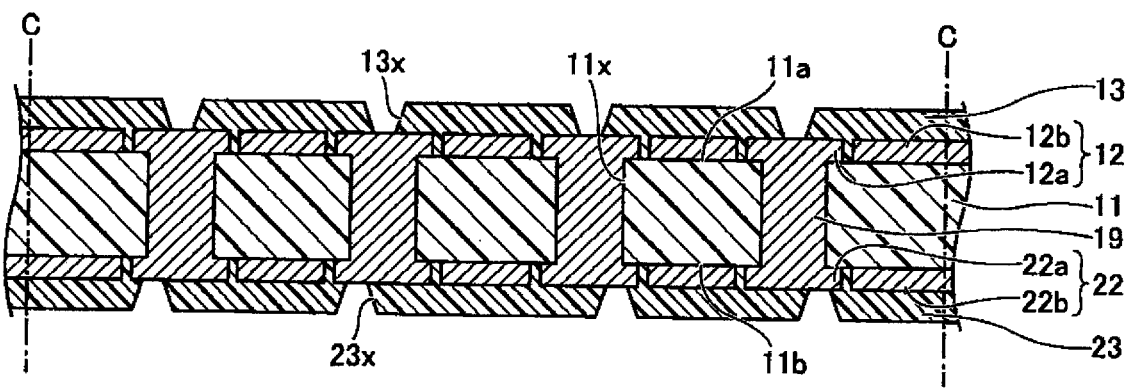

Next, in the process shown in FIG. 3B, the via hole 13x is formed in the insulating layer 13. The via hole 13x penetrates the insulating layer 13 and exposes the upper surface of the pad 12a of the wiring layer 12. Further, the via hole 23x is formed in the insulating layer 23. The via hole 23x penetrates the insulating layer 23 and exposes the lower surface of the pad 22a of the wiring layer 22. The via holes 13x, 23x can be formed by a laser machining process or the like using, for example, $CO_2$ laser or the like. When the via holes 13x, 23x are formed by the laser machining process, it is desirable to remove resin residue adhering to the surfaces of the pads 12a, 22a exposed to the bottom of the via holes 13x, 23x by performing desmear treatment. When the desmear treatment is performed, the inner wall surfaces of the via holes 13x, 23x and the upper surfaces of the insulating layers 13, 23 become roughened surfaces.

Figure 3C:
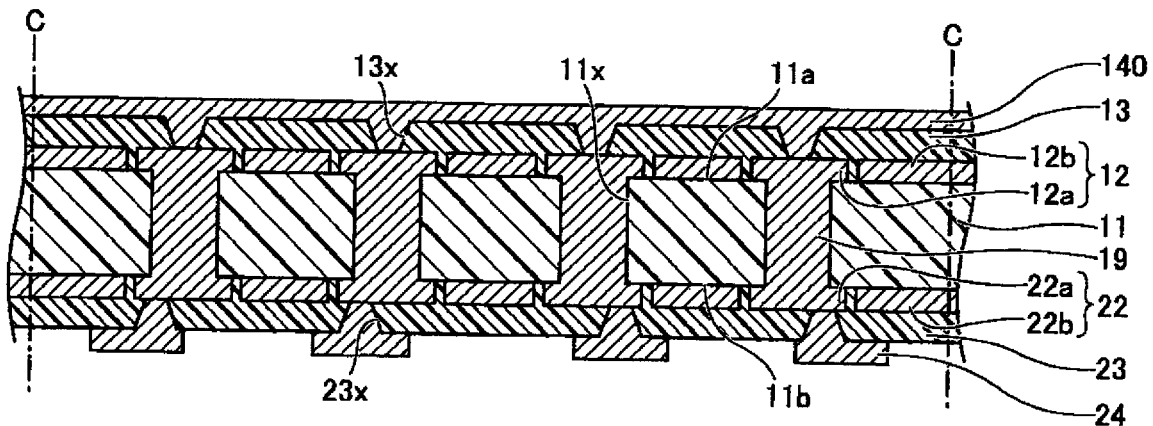

Next, in the process shown in FIG. 3C, a metal layer 140 is formed on one side of the insulating layer 13 and the wiring layer 24 is formed on the other side of the insulating layer 23. The metal layer 140 is a layer serving as the wiring layer 14 in the process shown in FIG. 4A. The metal layer 140 is formed so as to extend on the upper surface of the insulating layer 13 while filling the via hole 13x. For example, the metal layer 140 can be formed on the entire upper surface of the insulating layer 13. Here, the portion of the metal layer 140 that is formed on the upper surface of the insulating layer 13 is removed by polishing in a subsequent process. Accordingly, the metal layer 140 may be formed so as to extend only near the via hole 13x in the upper surface of the insulating layer 13 while filling the via hole 13x.

The metal layer 140 is electrically connected to the pad 12a exposed to the bottom of the via hole 13x. The wiring layer 24 includes a via wiring filled into the via hole 23x and a wiring pattern formed on the other surface of the insulating layer 23. The via hole 23x penetrates the insulating layer 23 and exposes the other surface of the pad 22a. The wiring layer 24 is electrically connected to the pad 22a exposed to the bottom of the via hole 23x.

As the material of the metal layer 140 and the wiring layer 24, for example, copper (Cu) or the like can be used. The metal layer 140 and the wiring layer 24 can be formed by using, for example, a semi-additive process. Details thereof are described in the following.

First, in order to form the metal layer 140, a seed layer (not shown) made of copper (Cu) or the like is formed on the entire upper surface of the insulating layer 13 by an electroless plating process or a sputtering process. Here, the entire upper surface of the insulating layer 13 includes the inner wall surface of the via hole 13x and the upper surface of the pad 12a exposed to the bottom of the via hole 13x. Furthermore, an electrolytic plating layer made of copper (Cu) or the like is formed on the seed layer by an electrolytic plating process using the seed layer as a power feeding layer. In this way, the metal layer 140 where the electrolytic plating layer is formed on the seed layer is formed. In this case, the metal layer 140 is formed on the entire upper surface of the insulating layer 13. When the metal layer 140 is selectively formed on the upper surface of the insulating layer 13, the method similar to the forming method of the wiring layer 24 described below can be used.

In order to form the wiring layer 24, first, a seed layer (not shown) made of copper (Cu) or the like is formed on the entire lower surface of the insulating layer 23 by an electroless plating process or a sputtering process. Here, the entire lower surface of the insulating layer 23 includes the inner wall surface of the via hole 23x and the lower surface of the pad 22a exposed to the bottom of the via hole 23x. Furthermore, a resist layer (not shown) is formed on the seed layer. The resist layer is provided with an opening portion corresponding to the wiring layer 24. Then, an electrolytic plating layer (not shown) made of copper (Cu) or the like is formed on the opening portion of the resist layer by an electrolytic plating process using the seed layer as a power feeding layer.

Subsequently, after removing the resist layer, the portion of the seed layer that is not covered by the electrolytic plating layer is removed by an etching process using the electrolytic plating layer as a mask. In this way, the wiring layer 24 where the electrolytic plating layer is formed on the seed layer is formed.

In this case, the metal layer 140 and the wiring layer 24 have a structure where the electrolytic plating layer is formed on the seed layer. However, in each of the drawings, the seed layer is not shown (the same applies to the other wiring layers).

Figure 4A:
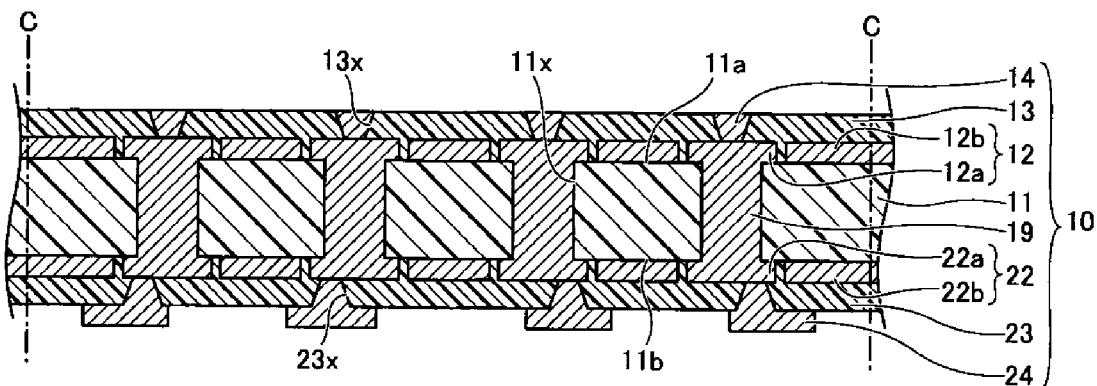
FIGS. 4A to 4C are views (third view) illustrating the manufacturing process of the wiring board according to the first embodiment.

Next, in the process shown in FIG. 4A, the metal layer 140 is polished to expose the upper surface of the insulating layer 13 and the upper surface of the metal layer 140 filling the via hole 13x. In this way, the wiring layer 14 that is a via wiring filled in the via hole 13x is formed. The upper surface of the wiring layer 14 can be flush with the upper surface of the insulating layer 13, for example.

For example, the wiring layer 14 can be formed by polishing and removing the metal layer 140 shown in FIG. 3C using a CMP process (chemical mechanical polishing process), except for the portion of the metal layer 140 filled in the via hole 13x. At this time, a portion of the upper surface of the insulating layer 13 may be removed at the same time. For example, the upper surface of the insulating layer 13 can be removed by about 3 to 5 μm. Normally, the thickness of the insulating layers 13, 23 is substantially the same. Accordingly, in this case, the thickness of the insulating layer 13 is thinner than that of the insulating layer 23 by about 3 to 5 μm.

The upper surface of the insulating layer 13 is polished together with the metal layer 140, so that a portion of the upper surface of the insulating layer 13 is removed. Accordingly, the roughness of the upper surface of the insulating layer 13 can be smaller than before polishing. That is, it is possible to improve the flatness of the upper surface of the insulating layer 13. Before being subjected to the CMP process (before being polished), the roughness of the upper surface of the insulating layer 13 is, for example, approximately Ra 300 to 400 nm. When the CMP process is performed, the roughness of the upper surface of the insulating layer 13 can be approximately Ra 15 to 40 nm. In this way, the flatness of the upper surface of the insulating layer 13 is improved with the reduction in the roughness thereof, so that fine wirings (high-density wiring patterns) can be formed in a subsequent process. With the above process, the first wiring member 10 is completed.

As a result of the polishing, the roughness of the upper surface of the insulating layer 13 becomes smaller than that of the inner wall surface of the via hole 13x. Since the roughness of the inner wall surface of the via hole 13x is large, it is possible to maintain a large adhesion between the via wiring (wiring layer 14) and the insulating layer 13. Accordingly, it can be prevented that an end of the via wiring (wiring layer 14) protrudes toward the wiring layer 31 to hinder the formation of the high-density wiring pattern.

The process shown in FIGS. 4B to FIG. 7A is a process of manufacturing the second wiring member 30. First, in the process shown in FIGS. 4B to FIG. 5B, the wiring layer 31 is formed on the upper surface of the insulating layer 13 of the first wiring member 10. The wiring layer 31 is patterned in a predetermined planar shape. The wiring layer 31 is electrically connected to the wiring layer 14 of the first wiring member 10. The wiring layer 31 can be formed by, for example, a semi-additive process or the like.

Figure 4B:
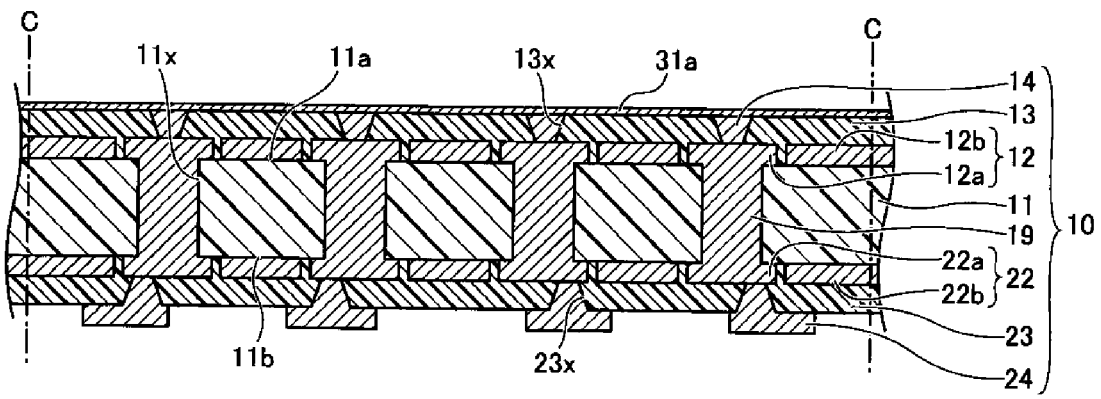

Specifically, first, as shown in FIG. 4B, titanium (Ti) layer and copper (Cu) layer or the like are formed on a flat surface, that is formed by the upper surface of the insulating layer 13 and the upper surface of the wiring layer 14, by, for example, a sputtering process, thereby forming a seed layer 31a. The thickness of the titanium (Ti) layer can be, for example, approximately 20 to 50 nm and the thickness of the copper (Cu) layer can be, for example, approximately 100 to 300 nm. The titanium (Ti) layer is formed below the seed layer 31a, so that the adhesion between the insulating layer 13 and the wiring layer 31 can be improved. Instead of the titanium (Ti), titanium nitride (TiN) or the like may be used. The titanium (Ti) and the titanium nitride (TiN) are metals that have higher corrosion resistance than copper. The electroless plating process may be used to form the seed layer 31a. However, a thinner layer can be formed when the sputtering process is used. Accordingly, it is desirable to use the sputtering process for the high density of the wiring layers.

Figure 4C:
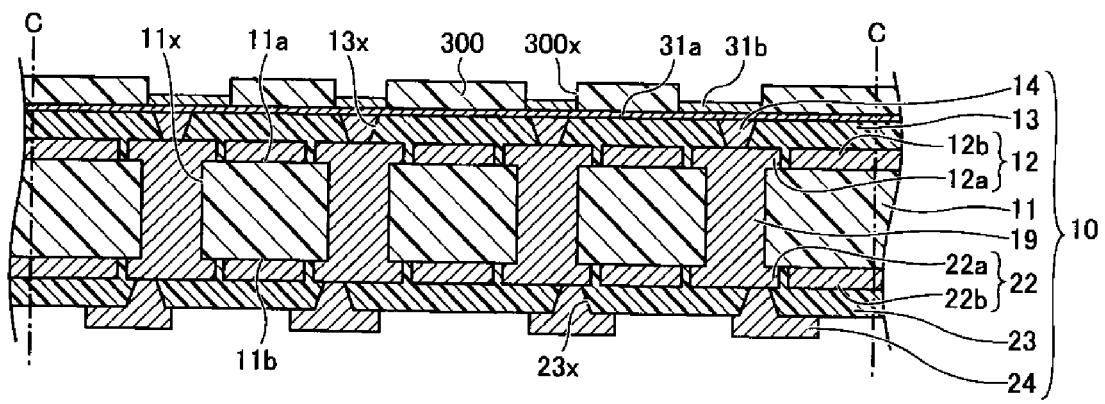

Next, as shown in FIG. 4C, a resist layer 300 is formed on the seed layer 31a. The resist layer 300 is provided with an opening portion 300x corresponding to the wiring layer 31. Then, by an electrolytic plating process using the seed layer 31a as a power feeding layer, an electrolytic plating layer 31b made of copper (Cu) or the like is formed in the opening portion 300x of the resist layer 300.

Figure 5A:
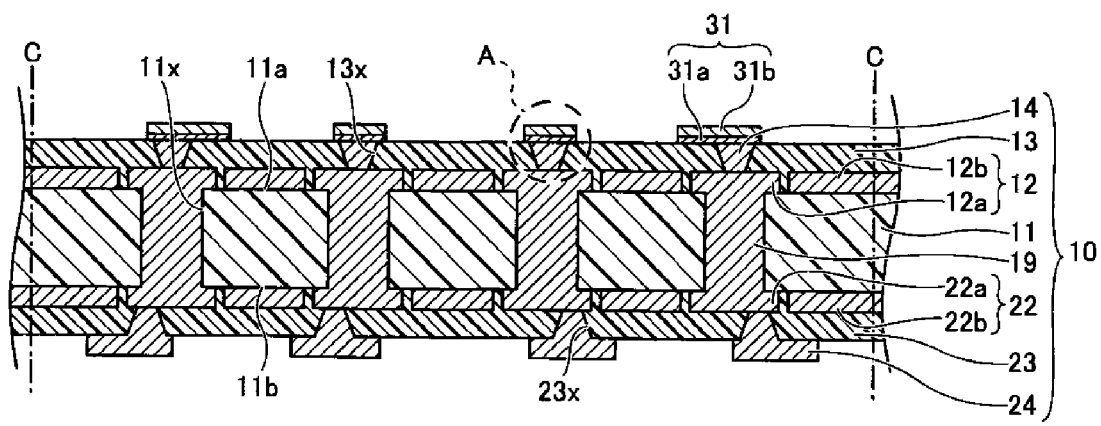
FIGS. 5A to 5C are views (fourth view) illustrating the manufacturing process of the wiring board according to the first embodiment.
Figure 5B:
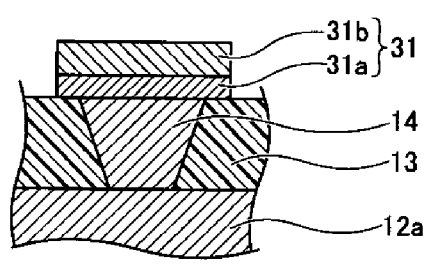

Next, as shown in FIG. 5A, after removing the resist layer 300 shown in FIG. 4C, the portion of the seed layer 31a that is not covered by the electrolytic plating layer 31b is removed by an etching process using the electrolytic plating layer 31b as a mask. In this way, the wiring layer 31 where the electrolytic plating layer 31b is formed on the seed layer 31a is formed. The upper surface of the wiring layer 14 is bonded to the electrolytic plating layer 31b of the wiring layer 31 through the seed layer 31a of the wiring layer 31. The thickness (total thickness of the seed layer 31a and the electrolytic plating layer 31b) of the wiring layer 31 can be, for example, approximately 1 to 3 µm. The line/space of the wiring layer 31 can be, for example, approximately 1 µm/1 µm. FIG. 5B is an enlarged view of "A" portion in FIG. 5A.

Before forming the seed layer 31a, the upper surface of the insulating layer 13 may be subjected to plasma treatment such as $O_2$ plasma ashing so that the upper surface of the insulating layer 13 is made to be roughened. Roughening the upper surface of the insulating layer 13 allows the adhesion between the insulating layer 13 and the seed layer 31a to be improved. However, as described above, the flatness of the upper surface of the insulating layer 13 is improved with the reduction in the roughness thereof, so that fine wirings can be formed. Accordingly, the upper surface of the insulating layer 13 is roughened to the extent there is no hindrance to the formation of the fine wirings in a subsequent process.

Figure 5C:
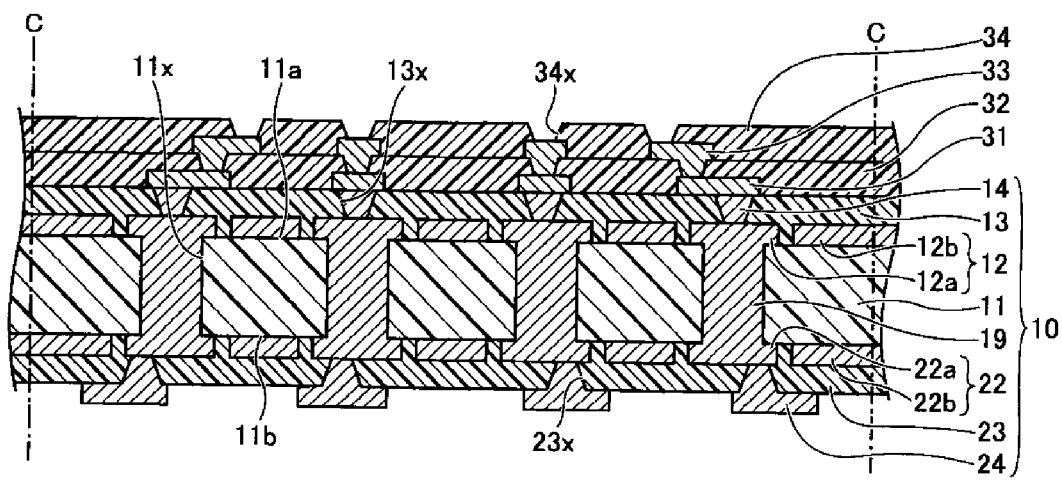

Next, in the process shown in FIG. 5C, the insulating layer 32, the wiring layer 33 and the insulating layer 34 are formed on the wiring layer 31. In FIGS. 5C to FIG. 7B, for convenience, a structure of the seed layer 31a and the electrolytic plating layer 31b in the wiring layer 31 is not shown.

Specifically, first, the insulating layer 32 is formed on the upper surface of the insulating layer 13 of the first wiring member 10 so as to cover the wiring layer 31. Then, the via hole 32x is formed in the insulating layer 32. The via hole 32x penetrates the insulating layer 32 and exposes the upper surface of the wiring layer 31. As the material of the insulating layer 32, a photosensitive insulating resin mainly composed of phenol-based resin or polyimide-based resin or the like, for example, can be used. The thickness of the insulating layer 32 can be, for example, approximately 5 to 10 µm. The insulating layer 32 may contain fillers such as silica ($SiO_2$).

Similarly to the process shown in FIG. 3A, the insulating layer 32 can be formed by the application or lamination of the insulating resin. At this point, the insulating layer 32 is not cured. The via hole 32x can be formed by, for example, a photolithography process. That is, the insulating layer 32 mainly composed of the photosensitive insulating resin can be exposed and developed and then cured, thereby forming the via hole 32x.

Next, the wiring layer 33 is formed on the insulating layer 32 by a semi-additive process or the like. Additionally, in the same manner as described above, the insulating layer 34 is formed and the via hole 34x is formed. The via hole 34x penetrates the insulating layer 34 and exposes the upper surface of the wiring layer 33. The material, thickness and diameter or the like of each layer are as described in the structure of the wiring board 1.

When forming the wiring layer 33 by the semi-additive process, the same method as in the formation of the seed layer 31a is used. That is, first, a seed layer is formed to cover the inner wall surface of the via hole 32x, the upper surface of the wiring layer 14 exposed to the bottom of the via hole 32x and the upper surface of the insulating layer 32. Then, a resist layer is formed on the seed layer. The resist layer is provided with an opening portion corresponding to the wiring layer 33. Then, an electrolytic plating layer is formed on the seed layer exposed from the opening portion of the resist layer by an electrolytic plating process using the seed layer as a power feeding layer. Then, the seed layer exposed from the electrolytic plating layer and the resist layer are removed, thereby forming the wiring layer 33.

Figure 6A:
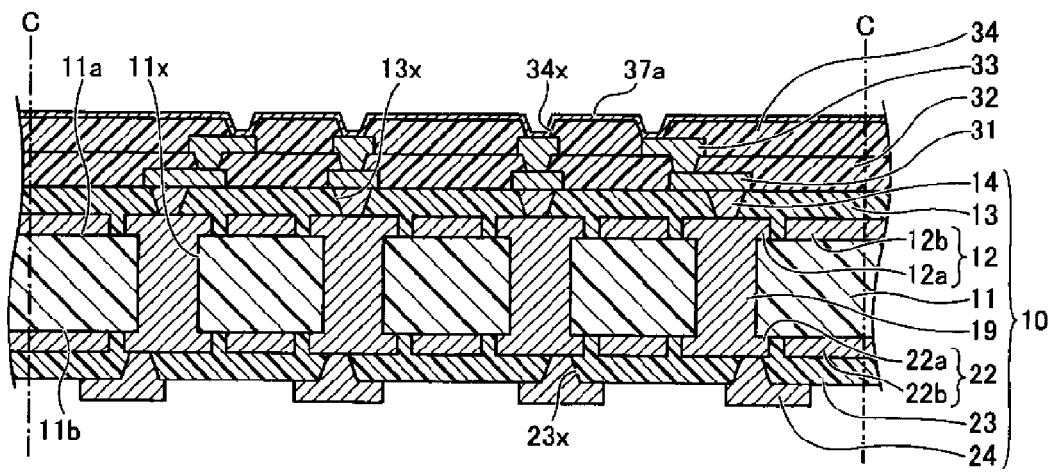
FIGS. 6A to 6C are views (fifth view) illustrating the manufacturing process of the wiring board according to the first embodiment.

Next, in the process shown in FIG. 6A, a seed layer 37a is formed by, for example, an electroless plating process or a sputtering process. The seed layer 37a continuously covers the upper surface of the wiring layer 33 exposed to the bottom of the via hole 34x, the inner wall surface of the via hole 34x and the upper surface of the insulating layer 34. The material, layer structure and thickness or the like of the seed layer 37a can be, for example, the same as the seed layer 31a.

Figure 6B:
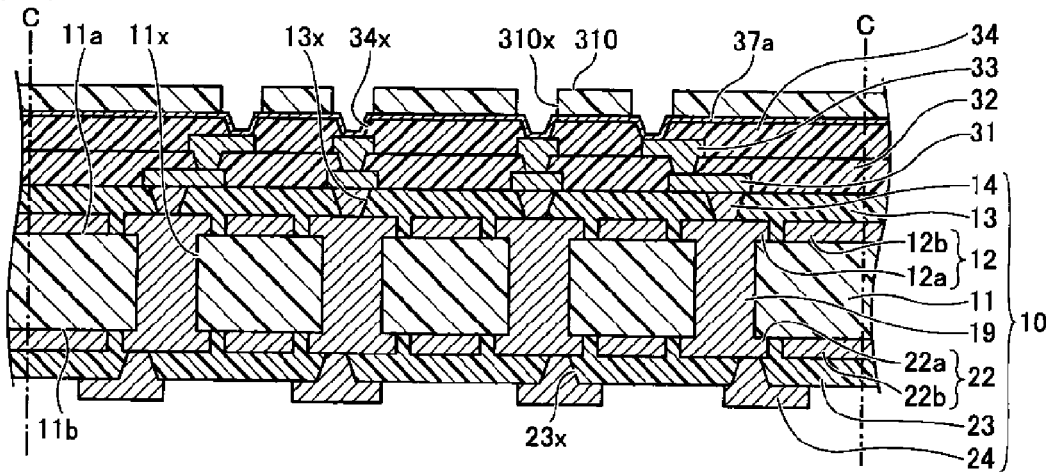

Next, in the process shown in FIG. 6B, a resist layer 310 is formed on the seed layer 37a formed on the upper surface of the insulating layer 34. The resist layer 310 is provided with an opening portion 310x corresponding to the wiring layer 37. Next, in the process shown in FIG. 6C, by an electrolytic plating process using the seed layer 37a as a power feeding layer, an electrolytic plating layer 37b made of copper (Cu) or the like is formed in the opening portion 310x of the resist layer 310.

Figure 6C:
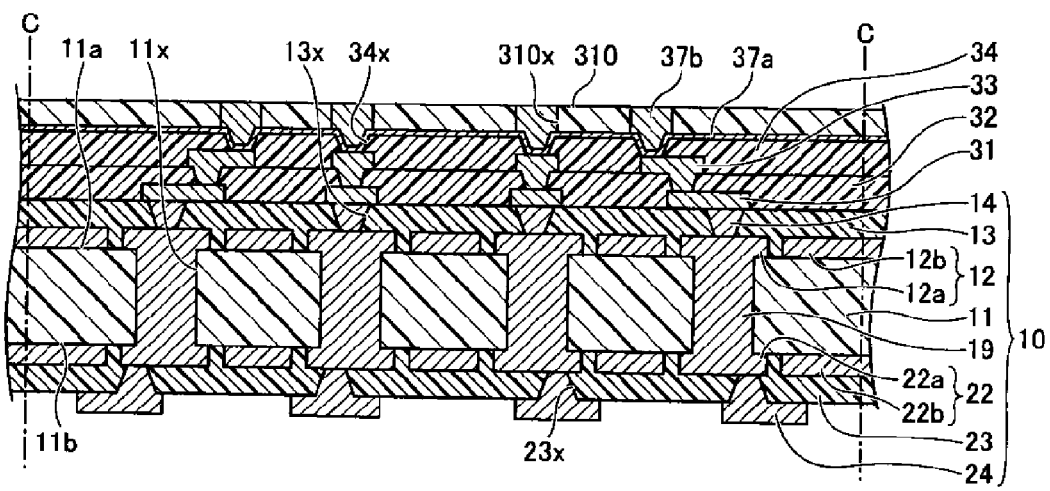
Figure 7A:
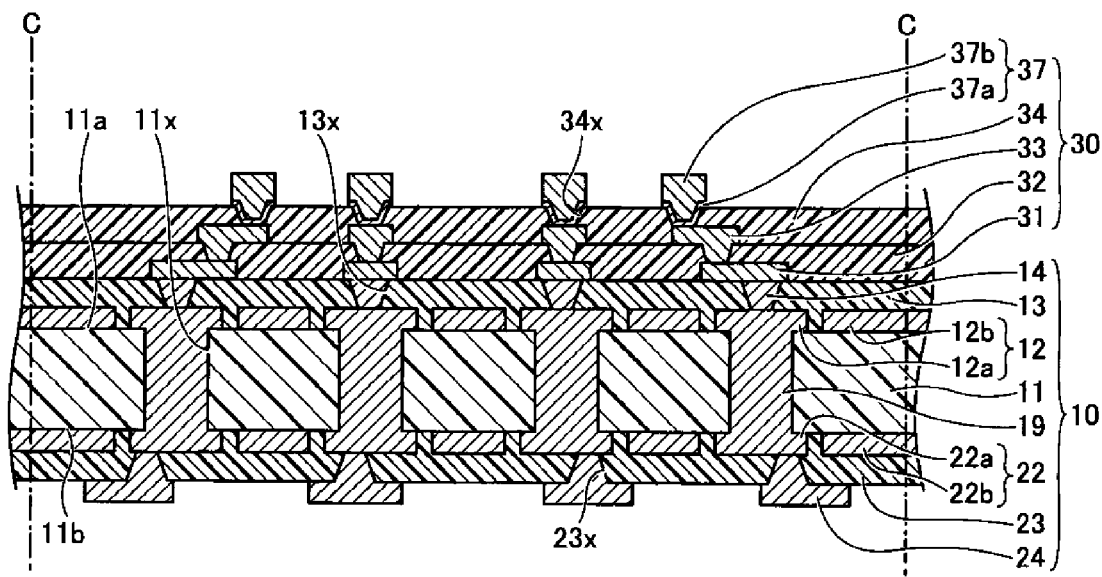
FIGS. 7A and 7B are views (sixth view) illustrating the manufacturing process of the wiring board according to the first embodiment.

Next, in the process shown in FIG. 7A, after removing the resist layer 310 shown in FIG. 6C, the portion of the seed layer 37a that is not covered by the electrolytic plating layer 37b is removed by an etching process using the electrolytic plating layer 37b as a mask. In this way, the wiring layer 37 where the electrolytic plating layer 37b is formed on the seed layer 37a is formed. The planar shape of the pad constituting the wiring layer 37 can be, for example, a circular shape with a diameter of approximately 20 to 30 μm. And then, the surface treatment layer described above may be formed on a surface (upper surface and side surface) of the pad constituting the wiring layer 37. With the above process, the second wiring member 30 is completed.

Figure 7B:
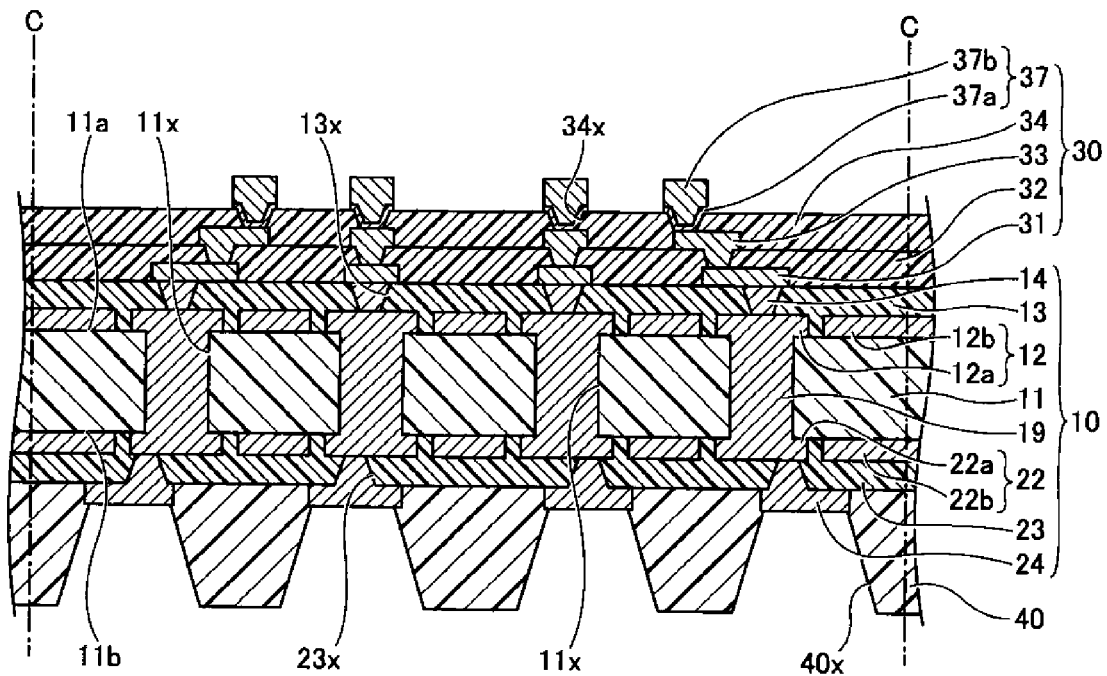

Next, in the process shown in FIG. 7B, the solder resist layer 40 is formed on the other surface of the insulating layer 23 of the first wiring member 10 so as to cover the wiring layer 24 of the first wiring member 10. The solder resist layer 40 is an outermost insulating layer. The solder resist layer 40 can be formed by, for example, the same method as the insulating layer 32 and the insulating layer 34, which are shown in FIG. 5C.

Then, for example, the opening portion 40x is formed by the same method as the via hole 34x shown in FIG. 5C. A portion of the wiring layer 24 of the first wiring member 10 is exposed to the bottom of the opening portion 40x. For example, the wiring layer 24 exposed to the bottom of the opening portion 40x functions as a pad that is electrically connected to a mounting board such as a motherboard. The surface treatment layer described above may be formed on the lower surface of the wiring layer 24 exposed to the bottom of the opening portion 40x. The solder resist layer 40 can be formed at any timing after the process shown in FIG. 3C.

After the process shown in FIG. 7B, by cutting the structure shown in FIG. 7B at a cutting position C using a slicer or the like, a plurality of individual wiring boards 1 (see FIG. 1) is completed.

In this way, in the wiring board 1, the plane layer 12b with a wide area is formed around the pad 12a on the one surface 11a of the core layer 11. By doing so, the ratio of the total area of the pad 12a and the plane layer 12b to the area of the one surface 11a of the core layer 11 is increased. Thereby, in the portion where the insulating layer 13 is formed, the irregularities to be formed by the one surface 11a of the core layer 11 and the wiring layer 12 are reduced. Therefore, only the pad or wiring pattern is formed on the one surface 11a of the core layer 11, so that it is easy to flatten the upper surface of the insulating layer 13, as compared to a case where many irregularities are present in the portion where the insulating layer 13 is formed.

Further, by polishing the upper surface of the insulating layer 13, the roughness of the upper surface of the insulating layer 13 is reduced to, for example, about Ra 15 to 40 nm, so that the flatness is improved. In this way, the high-density wiring pattern with, for example, a line/space of about 1 μm/1 μm can be formed on the upper surface of the insulating layer 13. That is, it is possible to realize the high-density of the wiring layer.

Modified Example of First Embodiment

A modified example of the first embodiment represents an example of a plane layer different from the first embodiment. In the modified example of the first embodiment, a description of the same components as those of the embodiments described above will be omitted.

Figure 8A:
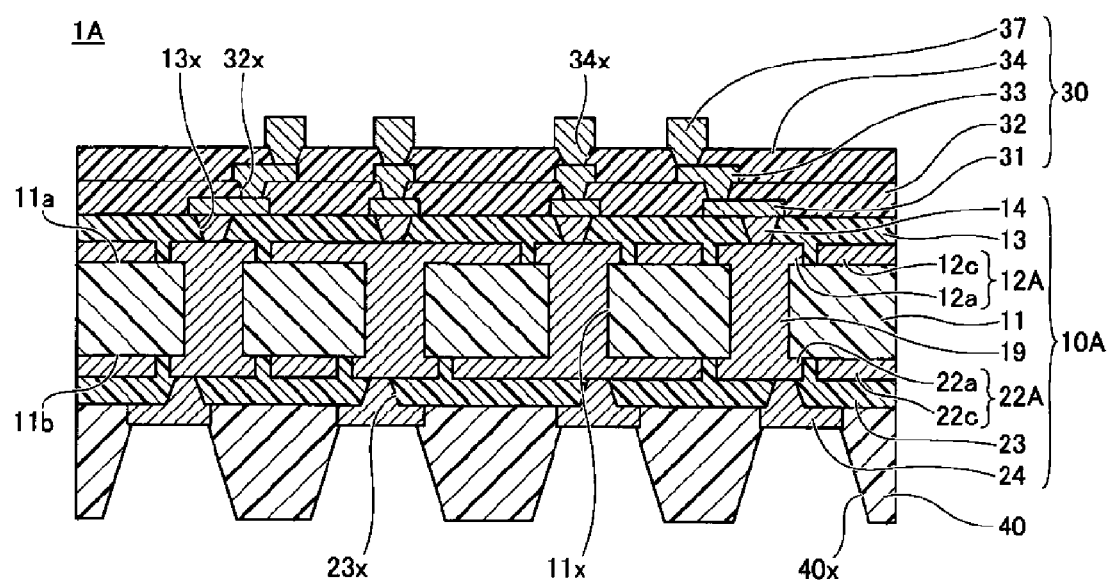
FIGS. 8A and 8B are views illustrating a wiring board according to a modified example of the first embodiment.
Figure 8B:
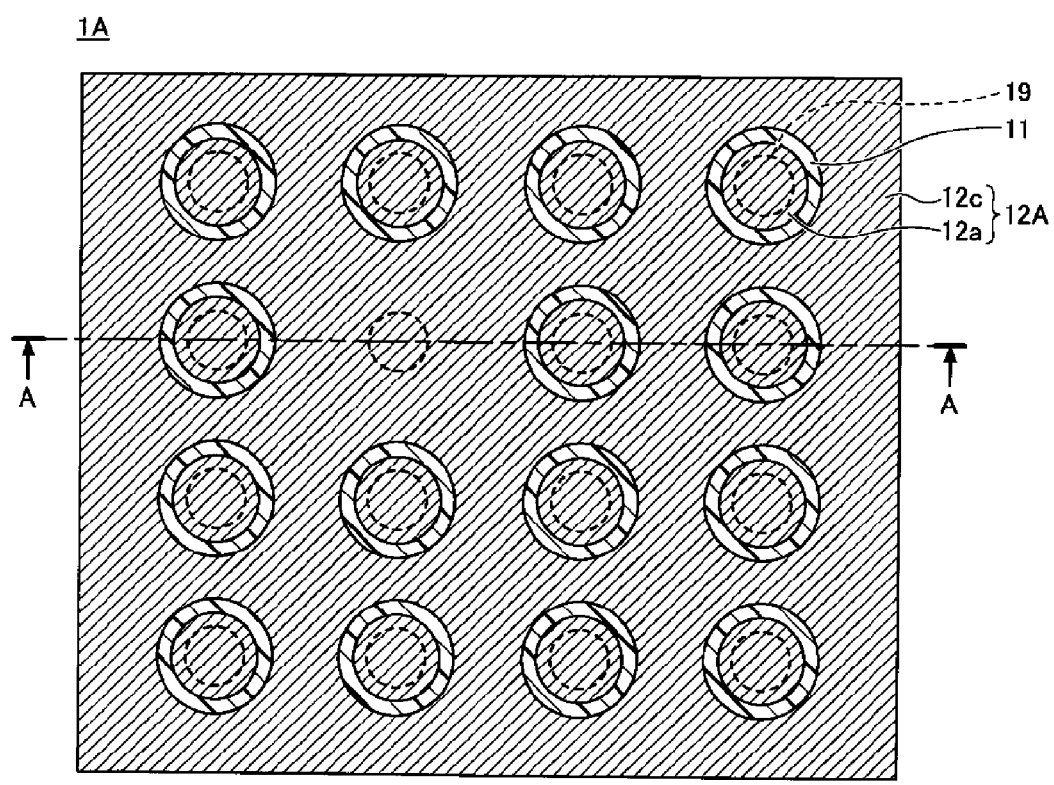

FIGS. 8A and 8B are views illustrating a wiring board according to the modified example of the first embodiment. FIG. 8B is a plan view and FIG. 8A is a sectional view taken along a line A-A in FIG. 8B. Here, layers above a wiring layer 12A are not shown in FIG. 8B. For convenience, a portion corresponding to the sectional view of FIG. 8A is hatched in the plan view of FIG. 8B.

Referring to FIG. 8A, a wiring board 1A according to the modified example of the first embodiment is different from the wiring board 1 (see FIG. 1A) in that the first wiring member 10 is substituted with a first wiring member 10A. The first wiring member 10A is provided with wiring layers 12A, 22A, instead of the wiring layers 12, 22 of the first wiring member 10.

The wiring layer 12A is formed on the one surface 11a of the core layer 11 and includes the pad 12a and a plane layers 12c. Around the pad 12a, the plane layers 12c are provided in a predetermined gap (e.g., about 20 μm). Unlike the plane layer 12b (see FIG. 1B), the plane layer 12c is conducted to some of the through wirings 19. The wiring layer 22A is formed on the other surface 11b of the core layer 11 and includes the pad 22a and a plane layer 22c. Around the pad 22a, the plane layers 22c are provided in a predetermined gap (e.g., about 20 μm). Unlike the plane layer 22b, the plane layer 22c is conducted to some of the through wirings 19.

Most (e.g., portion serving as s signal wiring) of the pad 12a and the pad 22a is electrically connected to each other through the through wiring 19 penetrating the core layer 11. Here, a portion of the pad 12a is electrically connected to the plane layer 22c through the through wiring 19. Further, a portion of the pad 22a is electrically connected to the plane layer 12c through the through wiring 19. For example, the material and thickness of the wiring layers 12A, 22A can be the same as those of the wiring layers 12, 22.

The pad 12a conducted to the plane layer 22c or the pad 22a conducted to the plane layer 12c can be, for example, a pad that is connected to a ground (GND) or a power supply. In this way, these pads are connected to a ground (GND) or a power supply of an external circuit (motherboard, etc.) that is connected to the wiring board 1A. Therefore, the plane layers 12c, 22c can be fixed to a potential of a ground (GND) or a power supply. Meanwhile, a portion of the via wiring (the wiring layer 14) is connected to the plane layer 12c. Further, a portion of the via wiring of the wiring layer 24 is connected to the plane layer 22c.

The ratio (remaining copper rate when the material of the wiring layer 12A is copper) of the total area of the pad 12a and the plane layer 12c to the area of the one surface 11a of the core layer 11 can be, for example, 80% or more. This is to facilitate the flattening of the upper surface of the insulating layer 13 to be formed on the wiring layer 12A. Meanwhile, the plane layers 12c, 22c may be divided into a plurality of regions independent of each other. In this case, each region may be fixed to other potentials (e.g., ground (GND) and power supply).

In this way, the wiring board 1A is connected to an external circuit (motherboard, etc.), so that the plane layers 12c, 22c can be fixed to a potential of a ground (GND) or a power supply. By doing so, it is possible to achieve an effect of shielding the noise from the outside to the pads 12a, 22a serving as the signal wiring.

Further, the plane layer 12c is arranged between the adjacent pads 12a serving as the signal wiring and the plane layer 22c is arranged between the adjacent pads 22a serving as the signal wiring. Therefore, it is possible to reduce electrical coupling (capacitive coupling) that occurs between the adjacent pads 12a serving as the signal wiring. Further, it is possible to reduce electrical coupling (capacitive coupling) that occurs between the adjacent pads 22a serving as the signal wiring. As a result, the pads 12a, 22a serving as the signal wiring themselves can be prevented from becoming a noise source.

Application Example of First Embodiment

An application example of the first embodiment represents an example of a semiconductor package where a semiconductor chip is mounted (flip chip-mounted) on the wiring board according to the first embodiment. In the application example of the first embodiment, a description of the same components as those of the embodiments described above will be omitted.

Figure 9:
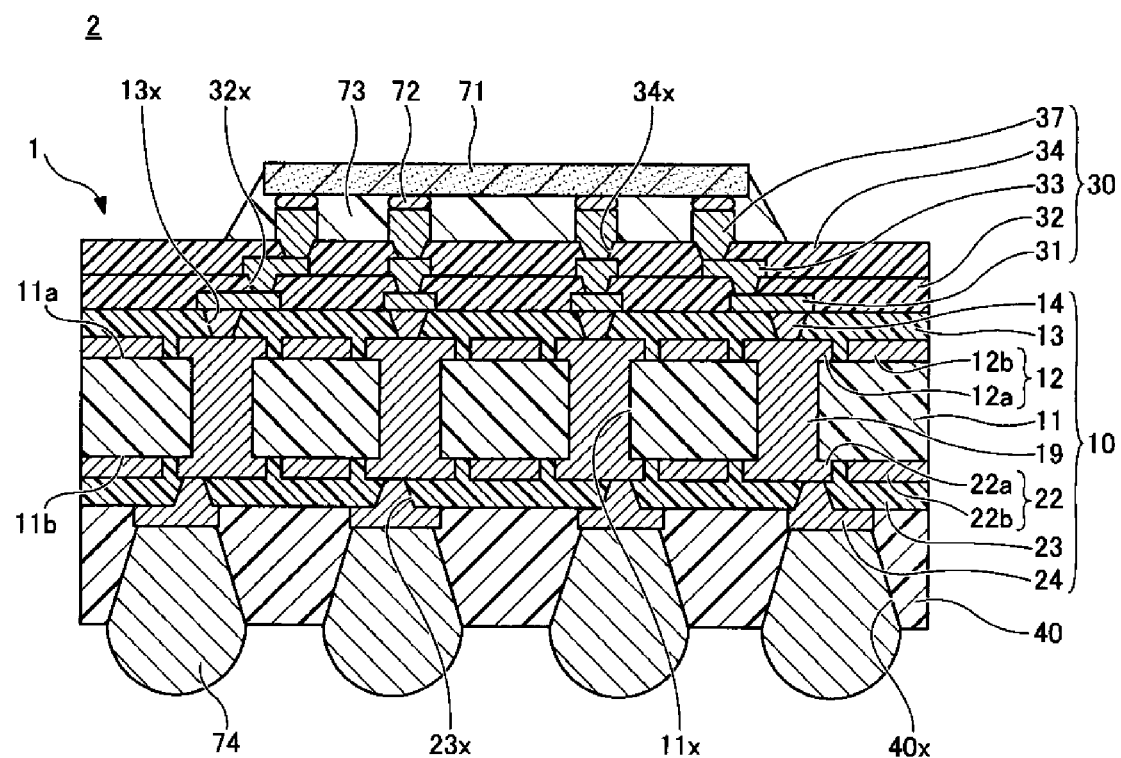
FIG. 9 is a sectional view (first view) illustrating a semiconductor package according to an application example of the first embodiment.

FIG. 9 is a sectional view illustrating a semiconductor package according to an application example of the first embodiment. Referring to FIG. 9, a semiconductor package 2 includes the wiring board 1 shown in FIG. 1A, a semiconductor chip 71, bumps 72, an underfill resin 73 and bumps 74. In the semiconductor package 2, the insulating layer 34 side (second insulating layer side) of the wiring board 1 is an electronic component mounting surface on which the semiconductor chip 71 as the electronic component is mounted. Further, the solder resist layer 40 side of the wiring board 1 is an external connection terminal surface on which an external connection terminal is formed.

In the semiconductor chip 71, for example, a semiconductor integrated circuit (not shown) or the like is formed on a thinned semiconductor board (not shown) made of silicon or the like. The semiconductor board (not shown) is formed with an electrode pad (not shown) that is electrically connected to the semiconductor integrated circuit (not shown).

The bump 72 is adapted to electrically connect the electrode pad (not shown) of the semiconductor chip 71 and the wiring layer 37 of the wiring board 1 to each other. The underfill resin 73 is filled between the semiconductor chip 71 and the upper surface of the wiring board 1. The bump 74 is an external connection terminal that is formed on the lower surface of the wiring layer 24 exposed to the bottom of the opening portion 40x of the solder resist layer 40. For example, the bump 74 is connected to a motherboard and the like. The bumps 72, 74 are, for example, solder bumps. As the material of the solder bump, for example, an alloy containing Pb, an alloy of Sn and Cu, an alloy of Sn and Ag, an alloy of Sn, Ag and Cu, or the like can be used.

In this way, the semiconductor chip is mounted on the wiring board according to the first embodiment, so that the semiconductor package can be realized.

Figure 10:
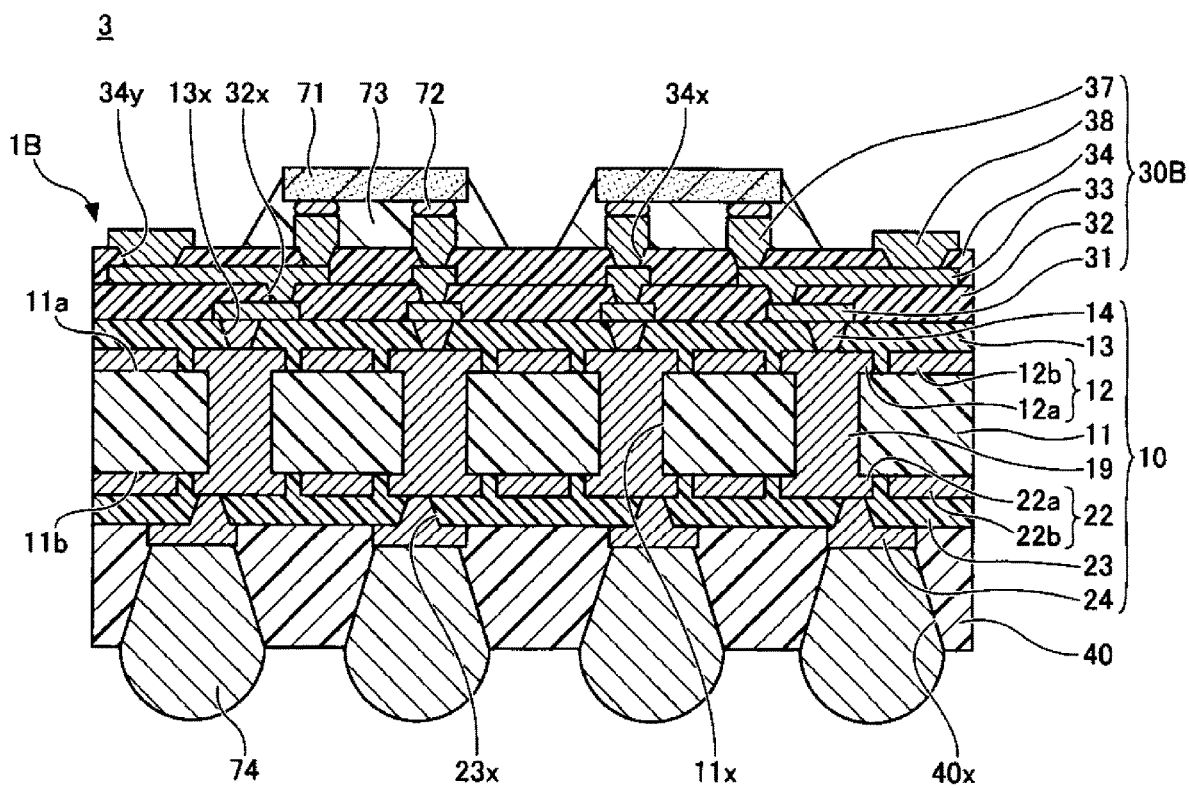
FIG. 10 is a sectional view (second view) illustrating a semiconductor package according to an application example of the first embodiment.

As in a semiconductor package 3 shown in FIG. 10, a plurality of semiconductor chips 71 may be mounted on a wiring board 1B. In this case, for example, a combination of a logic chip and a memory chip may be mounted on the wiring board 1B. Alternatively, a CPU chip and a DRAM chip may be mounted on the wiring board 1B, or a GPU chip and a DRAM chip may be mounted on the wiring board 1B.

Although the basic structure of the wiring board 1B shown in FIG. 10 is the same as that of the wiring board 1 shown in FIG. 1, the second wiring member 30 is substituted with a second wiring member 30B. The second wiring member 30B is different from the second wiring member 30 (see FIG. 1) in that an opening portion 34y selectively exposing the upper surface of the wiring layer 33 is provided in the insulating layer 34 and a wiring layer 38 extending on the upper surface of the insulating layer 34 around the opening portion 34y from the inside of the opening portion 34y is provided.

For example, the wiring layer 38 is arranged in a peripheral form around a region on which the semiconductor chip 71 is mounted. The planar shape of the wiring layer 38 can be a circular shape with a diameter of approximately 120 to 170 μm, for example. As necessary, the surface treatment layer described above may be formed on the surface of the wiring layer 38. The wiring layer 38 is provided as a pad for connecting the wiring board 1B to another wiring board or semiconductor package. Therefore, in the case where the semiconductor chip 71 is mounted on the wiring board 1B but the semiconductor chip 71 side of the wiring board 1B is not connected to another wiring board or the like, the opening portion 34y and the wiring layer 38 may be omitted. Further, the wiring board 1B may be modified in the same manner as in the modified example of the first embodiment.

Figure 11:
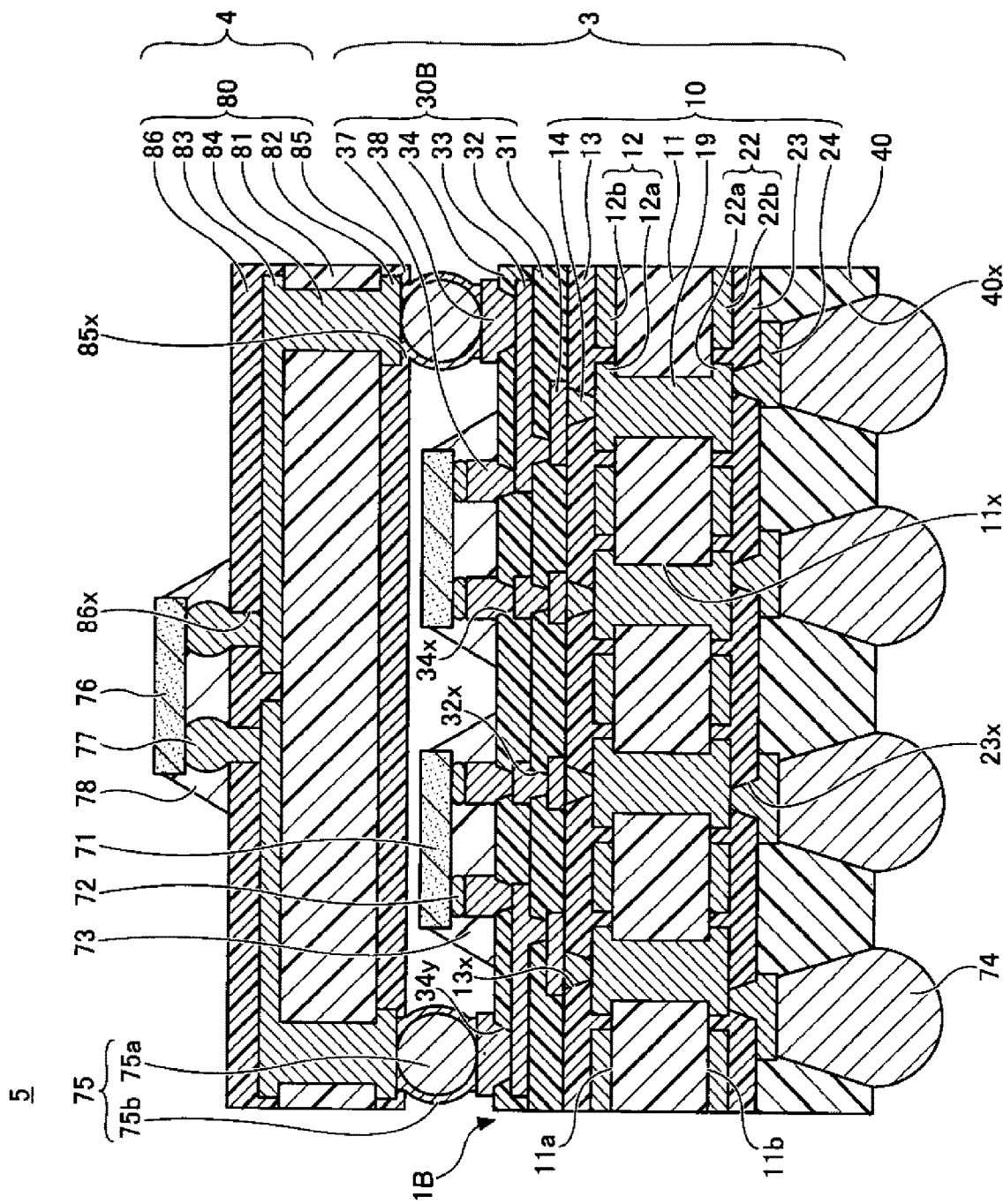
FIG. 11 is a sectional view (third view) illustrating a semiconductor package according to an application example of the first embodiment.

Also, as in a semiconductor package 5 shown in FIG. 11, it is possible to employ a semiconductor package with a POP (Package on package) structure where another semiconductor package 4 is additionally mounted on the semiconductor package 3 shown in FIG. 10. The semiconductor package 4 includes a wiring board 80, a semiconductor chip 76, bumps 77 and an underfill resin 78.

In the wiring board 80, a wiring layer 82 is formed on the lower surface of a core layer 81 and also, a solder resist layer 85 is provided. The solder resist layer 85 is provided with an opening portion 85x that selectively exposes the wiring layer 82 as a pad. Further, a wiring layer 83 is formed on the upper surface of the core layer 81 and also, a solder resist layer 86 is provided. The solder resist layer 86 is provided with an opening portion 86x that selectively exposes the wiring layer 83 as a pad. The wiring layer 82 and the wiring layer 83 are connected to each other through a through wiring 84 penetrating the core layer 81. As necessary, the surface treatment layer described above may be formed on the surfaces of the wiring layer 82 exposed to the opening portion 85x and the wiring layer 83 exposed to the opening portion 86x. Further, another wiring layer may be provided in the core layer 81.

An electrode pad (not shown) of the semiconductor chip 76 is electrically connected to the wiring layer 83 (pad) exposed to the opening portion 86x of the wiring board 80 through the bump 77. Here, the bump 77 is a solder bump. The underfill resin 78 is filled between the semiconductor chip 76 and the upper surface of the wiring board 80. The semiconductor chip 76 may have the same function as the semiconductor chip 71 or have a function different from the semiconductor chip 71.

The wiring layer 82 (pad) exposed to the opening portion 85x is arranged to face the wiring layer 38 (pad) of the semiconductor package 3 and has substantially the same shape as the wiring layer 38 (pad). The wiring layer 82 (pad) and the wiring layer 38 (pad) are connected through a solder ball 75. The solder ball 75 has a structure where a periphery of a copper core ball 75a is covered by a solder 75b.

The solder ball 75 functions as a bonding material for connecting (bonding) the semiconductor package 3 and the semiconductor package 4 to each other and functions as a spacer for holding a distance (spacing distance) between the semiconductor package 3 and the semiconductor package 4 to a prescribed value. That is, the solder 75b functions as the bonding material and the copper core ball 75a functions as the spacer. The height of the solder ball 75 is set to be higher than the total height of the thickness of the semiconductor chip 71, the thickness of the bump 72 and the protruding thickness of the wiring layer 37 from the wiring board 1B.

A sealing resin may be filled in a space between the semiconductor package 3 and the semiconductor package 4. With the filling of the sealing resin, the semiconductor package 3 is fixed relative to the semiconductor package 4 and the semiconductor chip 71 mounted on the wiring board 1B is sealed. Namely, the sealing resin functions not only as an adhesive for bonding the semiconductor package 3 and the semiconductor package 4 to each other, but also as a protective layer for protecting the semiconductor chip 71. Furthermore, by providing the sealing resin, it is possible to improve the entire mechanical strength of the semiconductor package 5.

Hereinabove, preferred embodiments or the like have been described in detail. However, the present invention is not limited thereto. Various modifications and replacements can be applied to the above-described embodiments without departing from the scope of the claims.

For example, in the example of FIG. 1, the via wiring (the wiring layer 14) may be connected to the plane layer 12b. Also, the via wiring of the wiring layer 24 may be connected to the plane layer 22b. In this way, the plane layers 12b, 22b may be used as a ground plane or a power supply plane.

Further, in a range that does not cause a problem in flatness and residual copper rate, wiring patterns may be provided in each plane layer.

Further, in order to improve the rigidity of the wiring board, the insulating layer 13 or the insulating layer 23 may contain a reinforcing material. In this insulating layer, an epoxy-based resin or polyimide-based resin is impregnated in a reinforcing material of a non-woven fabric or woven fabric such as glass fiber, carbon fiber and aramid fiber.

Also, in order to improve the adhesion between the plane layer 12b and the insulating layer 13, the plane layer 12b may have a mesh form or through holes may be formed in the plane layer 12b. Similarly, in order to improve the adhesion between the plane layer 22b and the insulating layer 23, the plane layer 22b may have a mesh form or through holes may be formed in the plane layer 22b. In this case, it is required to form fine meshes or through holes that will not affect the flatness of the upper surface of the insulating layer 13.

Further, the plane layer may not be formed on the other surface of the core layer on which the high-density wiring layer is not formed.

Further, in the example of FIG. 1, the pad 12a connected to the via wiring (the wiring layer 14) may be formed on the surface 11a of the core layer 11 other than the position located directly above the through wiring 19. In this case, the pad 12a and an end portion of the through wiring 19 are connected to each other via the wiring pattern formed on the surface 11a.

Similarly, the pad 22a connected to the via of the wiring layer 24 may be formed on the surface 11b of the core layer 11 other than the position located directly above the through wiring 19. In this case, the pad 22a and an end portion of the through wiring 19 are connected to each other via the wiring pattern formed on the surface 11b.

CLAUSES

This disclosure further encompasses various exemplary embodiments, for example, described below.

1. A method of manufacturing a wiring board comprising:
   forming a first wiring layer on one surface of a core layer, the first wiring layer comprising a pad and a plane layer provided around the pad;
   forming a first insulating layer on the one surface of the core layer so as to cover the first wiring layer;
   forming a via hole exposing the pad in the first insulating layer;
   forming a metal layer filling the via hole on the first insulating layer;
   polishing the metal layer to expose an upper surface of the first insulating layer and forming a via wiring having an end surface exposed to the upper surface of the first insulating layer;
   forming a second wiring layer on the upper surface of the first insulating layer, the second wiring layer being directly bonded to the end surface of the via wiring; and
   forming a second insulating layer on the second wiring layer, the second insulating layer being thinner than the first insulating layer.

2. The manufacturing method of the wiring board according to claim 1, comprising:
   forming a third wiring layer on the other surface of the core layer;
   forming a third insulating layer on the other surface of the core layer so as to cover the third wiring layer;
   forming a fourth wiring layer on a second surface of the third insulating layer, the second surface being an opposite surface of a surface in contact with the core layer; and
   forming a solder resist layer on the second surface of the third insulating layer so as to selectively expose the fourth wiring layer.

3. The manufacturing method of the wiring board according to claim 1, wherein in the polishing the metal layer, the first insulating layer is polished together with the metal layer so as to flatten the upper surface of the first insulating layer.

What is claimed is:
1. A wiring board comprising:
   a core layer;
   a first wiring layer formed on a first surface of the core layer;
   a first insulating layer formed on the first surface of the core layer so as to cover the first wiring layer;
   a via wiring embedded in the first insulating layer, the via wiring being a metal layer filled in a via hole formed in the first insulating layer;
   a second wiring layer formed on a first surface of the first insulating layer, the first surface of the first insulating layer being an opposite surface of a surface in contact with the core layer, the second wiring layer having a structure where an electrolytic plating layer is formed on a seed layer;
   a second insulating layer formed on the first surface of the first insulating layer so as to cover the second wiring layer, the second insulating layer being thinner than the first insulating layer;

a third wiring layer formed on a first surface of the second insulating layer, the first surface of the second insulating layer being an opposite surface of a surface in contact with the first insulating layer;
a third insulating layer formed on the first surface of the second insulating layer so as to cover the third wiring layer; and
a solder resist layer formed on a second surface of the core layer, the second surface of the core layer being opposite the first surface of the core layer,
wherein the first wiring layer comprises a pad and a plane layer provided around the pad,
one end surface of the via wiring is exposed from the first surface of the first insulating layer and flush with the first surface of the first insulating layer,
an entirety of the one end surface of the via wiring is directly bonded to the seed layer constituting the second wiring layer,
another end surface of the via wiring is directly bonded to the pad in the first insulating layer, and
a thickness of the solder resist layer is equal to or greater than a total thickness of the second insulating layer and the third insulating layer.

2. The wiring board according to claim 1, wherein the third insulating layer is thinner than the first insulating layer.

3. The wiring board according to claim 1, wherein the first insulating layer contains a filler, and
the second insulating layer and the third insulating layer contain a smaller amount of filler than the first insulating layer or do not contain any filler.

4. The wiring board according to claim 1, wherein the first insulating layer is formed of non-photosensitive insulating resin, and
the second insulating layer, the third insulating layer, and the solder resist layer are formed of photosensitive insulating resin.

5. The wiring board according to claim 1, wherein the plane layer is connected to a ground or a power supply.

6. The wiring board according to claim 1, comprising:
a fourth wiring layer formed on the second surface of the core layer;
a fourth insulating layer formed on the second surface of the core layer so as to cover the fourth wiring layer; and
a fifth wiring layer formed on a second surface of the fourth insulating layer, the second surface being an opposite surface of a surface in contact with the core layer,
wherein the solder resist layer is formed on the second surface of the fourth insulating layer so as to selectively expose the fifth wiring layer.

7. The wiring board according to claim 6, wherein the third insulating layer has an electronic component mounting surface on which an electronic component is mounted, and the solder resist layer has an external connection terminal surface on which an external connection terminal is formed.

8. The wiring board according to claim 6, wherein the fourth wiring layer comprises a fourth wiring layer pad and a fourth wiring layer plane layer provided around the fourth wiring layer pad, and
the fourth wiring layer pad is connected to the pad of the first wiring layer through a through wiring penetrating the core layer.

9. The wiring board according to claim 6, wherein a resin forming the first insulating layer and the fourth insulating layer is non-photosensitive, and
a resin forming the second insulating layer, the third insulating layer, and the solder resist layer is photosensitive.

10. The wiring board according to claim 6, wherein an elastic modulus of the first insulating layer and the fourth insulating layer is smaller than that of the core layer, and
an elastic modulus of the second insulating layer, the third insulating layer, and the solder resist layer is smaller than that of the first insulating layer and the fourth insulating layer.

11. The wiring board according to claim 10, wherein a thermal expansion coefficient of the first insulating layer and the fourth insulating layer is greater than that of the core layer, and
a thermal expansion coefficient of the second insulating layer, the third insulating layer, and the solder resist layer is greater than that of the first insulating layer and the fourth insulating layer.

12. The wiring board according to claim 11, wherein a wiring density of the second wiring layer and the third wiring layer is higher than a wiring density of the first wiring layer.

13. The wiring board according to claim 1, wherein a thickness of the second insulating layer and the third insulating layer is approximately 5 to 10 µm and a thickness of the first insulating layer is approximately 20 to 45 µm.

14. The wiring board according to claim 1, wherein a ratio of the total thickness of the second insulating layer and the third insulating layer to the thickness of the solder resist layer is 0.75 to 1.

15. The wiring board according to claim 1, wherein roughness of the surface of the first insulating layer is smaller than that of an inner wall defining a via hole in which the via wiring is embedded.

16. The wiring board according to claim 1, wherein a ratio of a total area of the pad and the plane layer to an area of the first surface of the core layer is in a range of 70% to 90%.

* * * * *